US012568769B2

(12) United States Patent
Tomioka et al.

(10) Patent No.: US 12,568,769 B2
(45) Date of Patent: Mar. 3, 2026

(54) MEMORY DEVICE HAVING A FIRST LAYER DISPOSED BETWEEN A MEMORY ELEMENT AND A SWITCHING ELEMENT THEREOF

(71) Applicant: Kioxia Corporation, Tokyo (JP)

(72) Inventors: Kazuhiro Tomioka, Yokohama Kanagawa (JP); Kazuya Sawada, Seoul (KR)

(73) Assignee: Kioxia Corporation, Tokyo (JP)

( * ) Notice: Subject to any disclaimer, the term of this patent is extended or adjusted under 35 U.S.C. 154(b) by 698 days.

(21) Appl. No.: 17/884,790

(22) Filed: Aug. 10, 2022

(65) Prior Publication Data

US 2023/0284537 A1     Sep. 7, 2023

(30) Foreign Application Priority Data

Mar. 4, 2022     (JP) ................................. 2022-033696

(51) Int. Cl.
| | |
|---|---|
| *H10N 50/10* | (2023.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............. *H10N 50/10* (2023.02); *H10B 61/22* (2023.02); *H10N 50/01* (2023.02); *H10N 50/80* (2023.02); *H10N 50/85* (2023.02)

(58) Field of Classification Search
CPC ........ H10N 50/10; H10N 50/01; H10N 50/80; H10N 50/85; H10B 61/22; H10B 63/10; H10B 61/10; H10B 63/20

USPC ........................................................... 257/23
See application file for complete search history.

(56) References Cited

U.S. PATENT DOCUMENTS

| | | | |
|---|---|---|---|
| 7,382,647 B1 | 6/2008 | Gopalakrishnan | |
| 8,962,349 B1 * | 2/2015 | Chen ...................... | H10N 50/01 |
| | | | 257/422 |
| 10,177,308 B2 | 1/2019 | Yang et al. | |
| 10,217,934 B2 | 2/2019 | Yang et al. | |

(Continued)

FOREIGN PATENT DOCUMENTS

| | | | |
|---|---|---|---|
| JP | 4583503 B2 | 9/2010 | |
| JP | 2018152432 A | 9/2018 | |
| WO | WO2019005172 A1 * | 1/2019 | ............. H10B 61/10 |

OTHER PUBLICATIONS

U.S. Appl. No. 17/549,248, First Named Inventor: Taiga Isoda; Title: "Magnetoresistance Memory Device"; Filed: Dec. 13, 2021.

(Continued)

*Primary Examiner* — Duy T Nguyen
(74) *Attorney, Agent, or Firm* — Holtz, Holtz & Volek PC

(57)     ABSTRACT

According to one embodiment, a memory device includes a memory element provided above a substrate in a first direction perpendicular to a first surface of the substrate; a switching element provided between the substrate and the memory element; and a first layer provided between the memory element and the switching element. The first layer includes at least one selected from the group including boron, carbon, silicon, magnesium, aluminum, scandium, titanium, vanadium, gallium, germanium, yttrium, zirconium, niobium, molybdenum, palladium, silver, hafnium, tantalum, tungsten, iridium, and platinum. The first layer includes an air gap.

15 Claims, 16 Drawing Sheets

(56)  References Cited

U.S. PATENT DOCUMENTS

| | | | | |
|---|---|---|---|---|
| 10,304,509 | B2 | 5/2019 | Yoshikawa et al. | |
| 11,316,095 | B2 | 4/2022 | Oikawa et al. | |
| 11,329,215 | B2 | 5/2022 | Sawada et al. | |
| 11,404,098 | B2 | 8/2022 | Isoda et al. | |
| 2008/0037184 | A1* | 2/2008 | Uesugi | G11B 5/3906 |
| | | | | 360/110 |
| 2009/0141543 | A1* | 6/2009 | Ho | G11C 11/5607 |
| | | | | 365/158 |
| 2010/0264501 | A1* | 10/2010 | Furuta | B82Y 10/00 |
| | | | | 257/E29.323 |
| 2018/0261270 | A1* | 9/2018 | Yoshikawa | H10N 50/80 |
| 2018/0358547 | A1* | 12/2018 | Yang | H10B 61/10 |
| 2021/0074911 | A1 | 3/2021 | Isoda et al. | |
| 2021/0288240 | A1 | 9/2021 | Sawada et al. | |
| 2021/0288243 | A1 | 9/2021 | Ochiai et al. | |
| 2022/0085278 | A1* | 3/2022 | Igarashi | H10N 50/10 |
| 2022/0085279 | A1 | 3/2022 | Sawada et al. | |
| 2022/0093847 | A1* | 3/2022 | Ochiai | G11C 11/161 |
| 2022/0093848 | A1 | 3/2022 | Kitagawa et al. | |
| 2022/0199136 | A1 | 6/2022 | Isoda et al. | |
| 2022/0238792 | A1 | 7/2022 | Sawada et al. | |

OTHER PUBLICATIONS

U.S. Appl. No. 17/691,652, First Named Inventor: Kazuya Sawada; Title: "Magnetoresistance Memory Device and Manufacturing Method of Magnetoresistance Memory Device"; Filed: Mar. 10, 2022.
U.S. Appl. No. 17/842,417, First Named Inventor: Tadaaki Oikawa; Title: "Magnetic Memory Device"; Filed: Jun. 16, 2022.

* cited by examiner

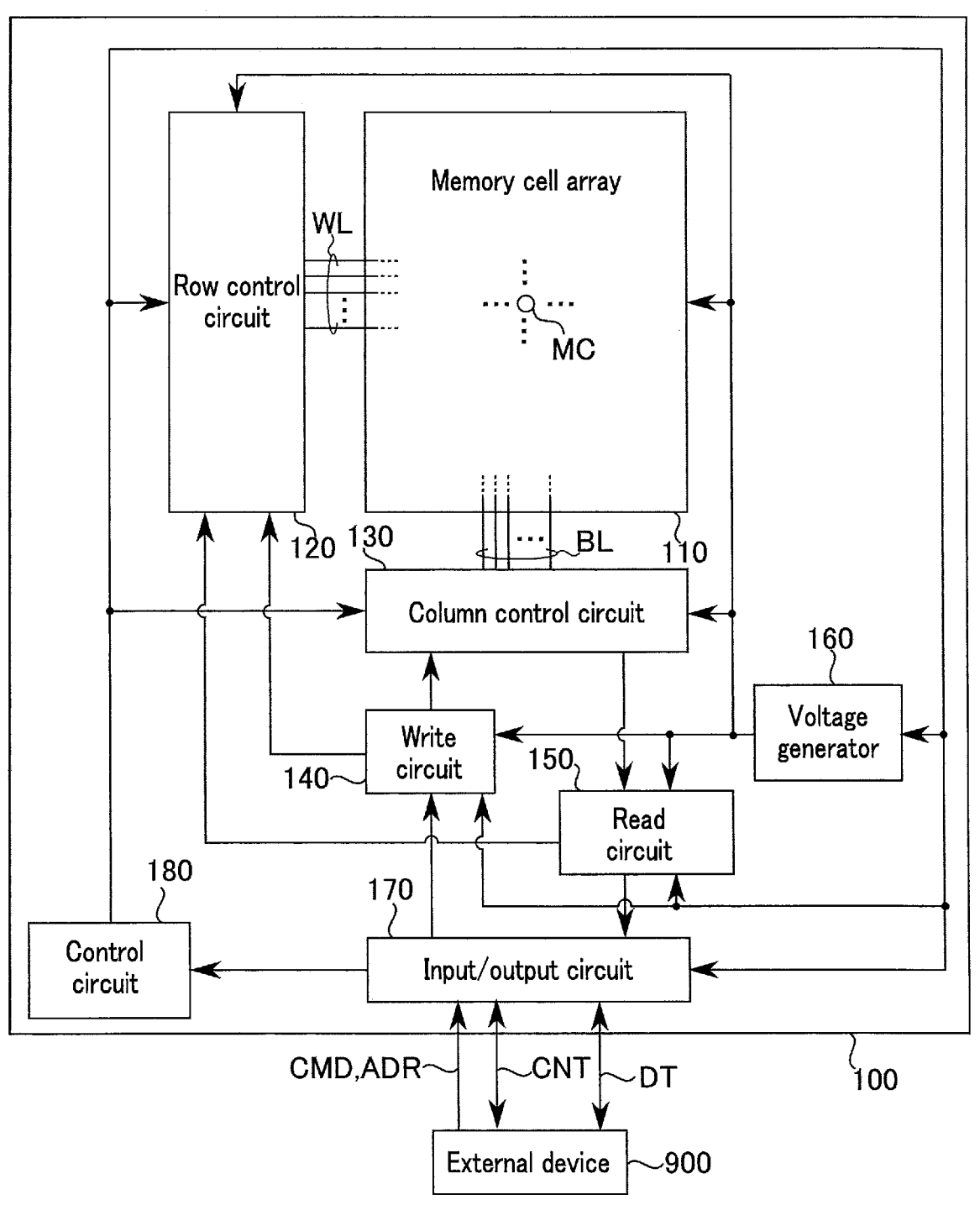
F I G. 1

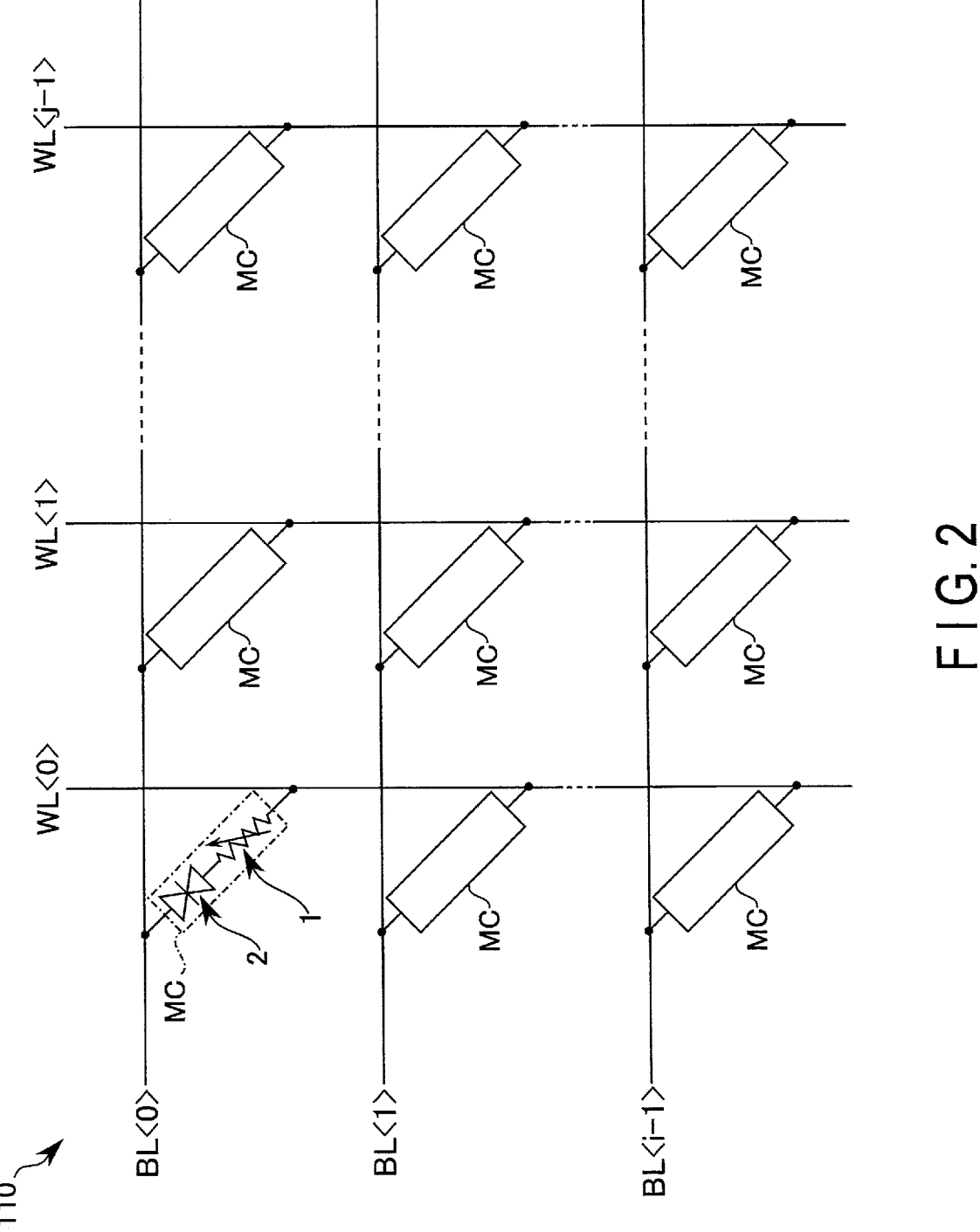
F I G. 2

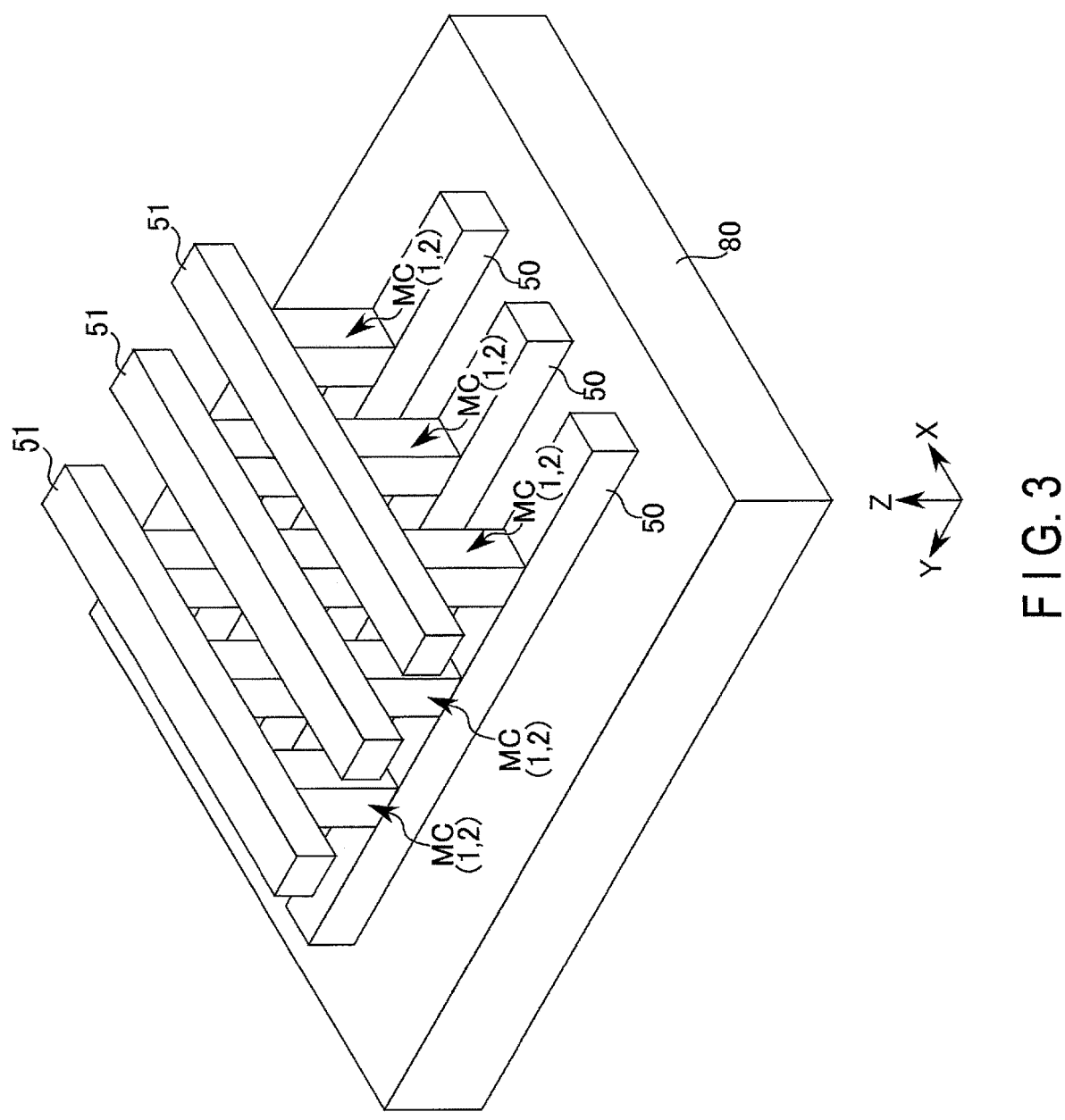
F I G. 3

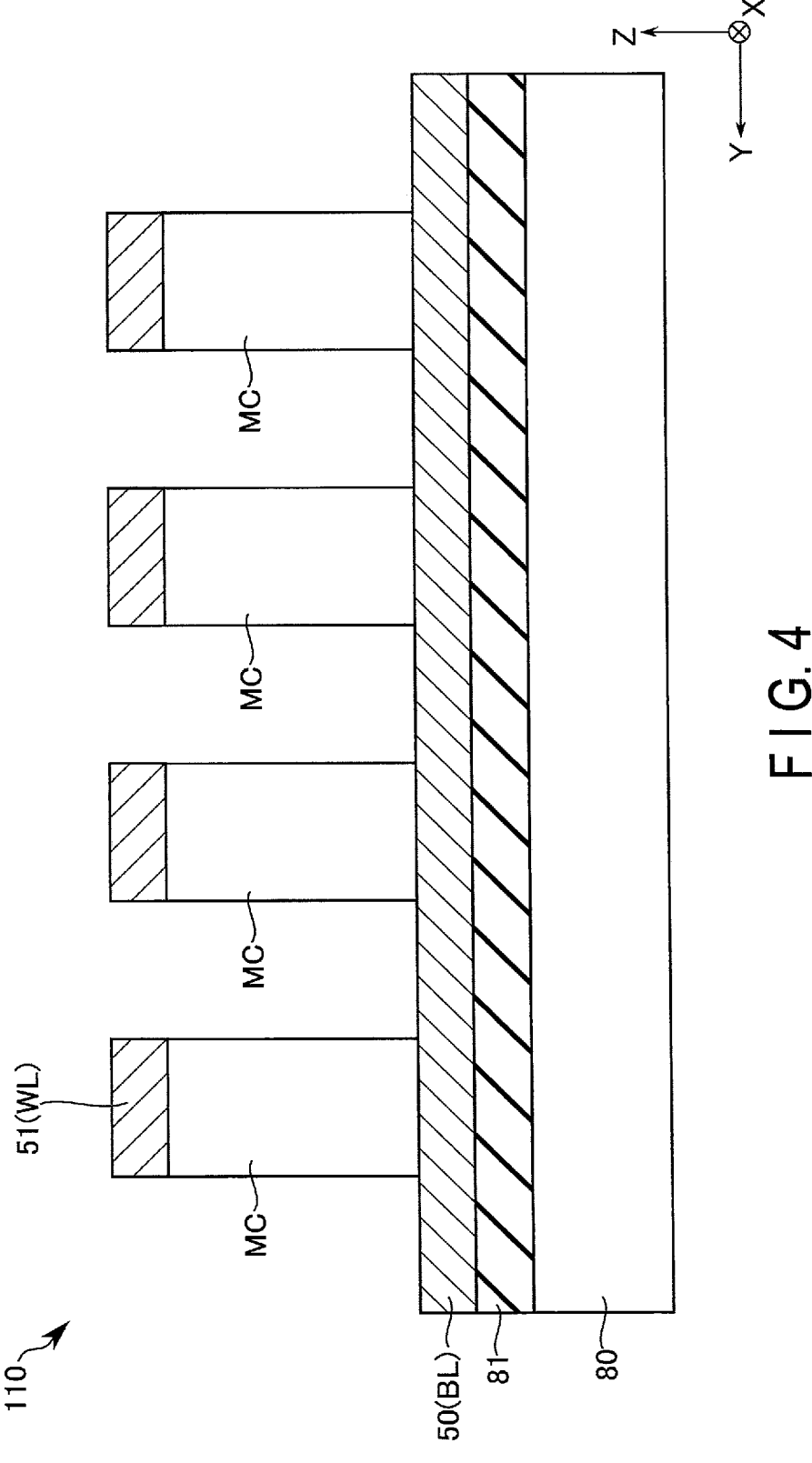
F I G. 4

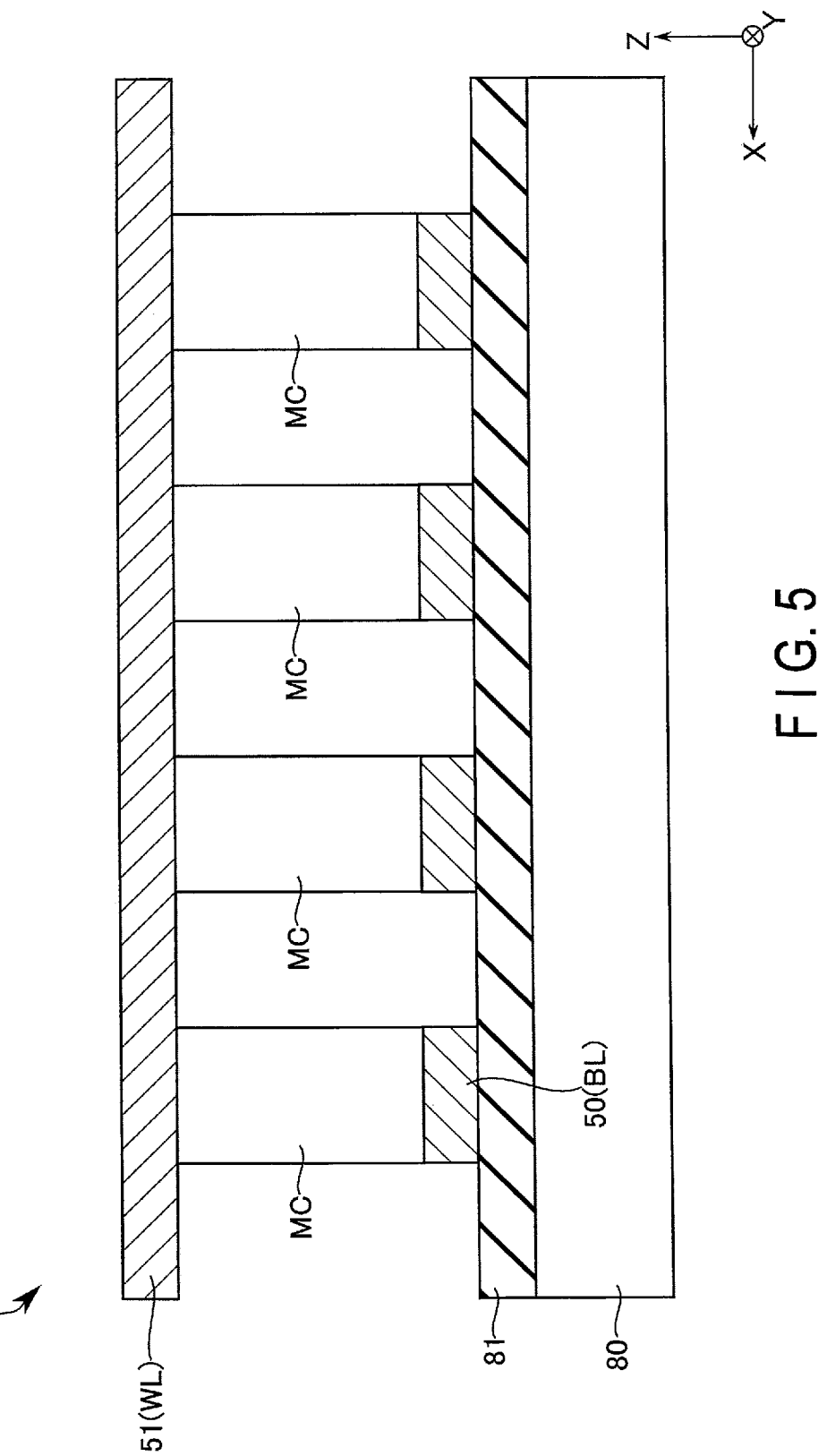
F I G. 5

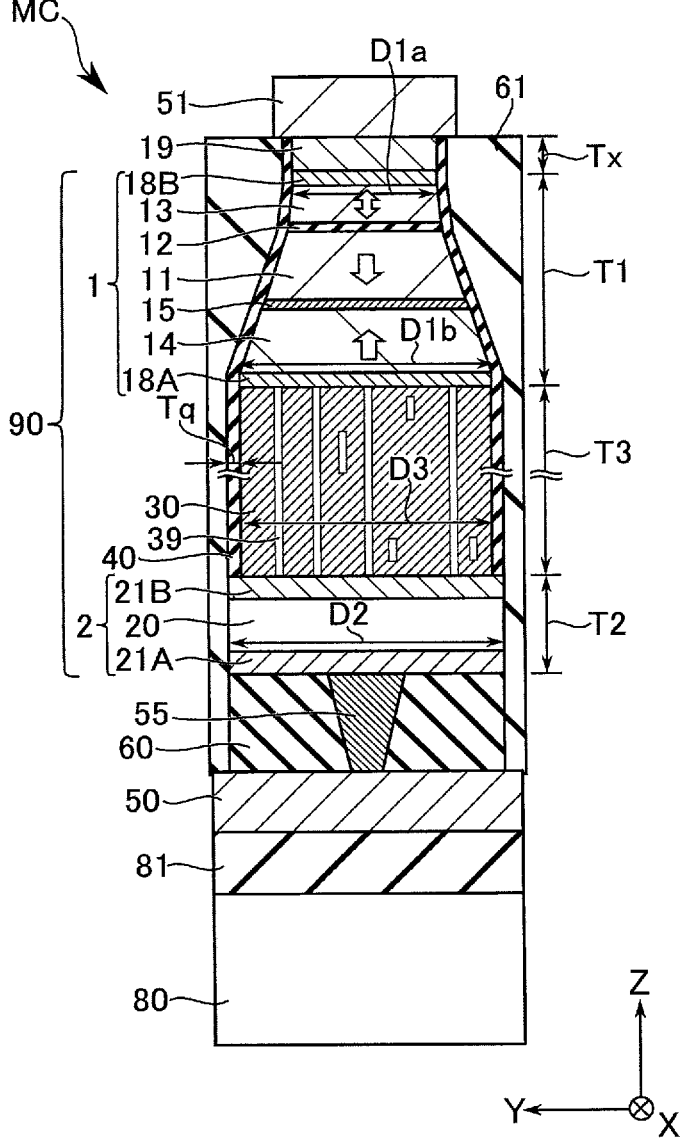
F I G. 6

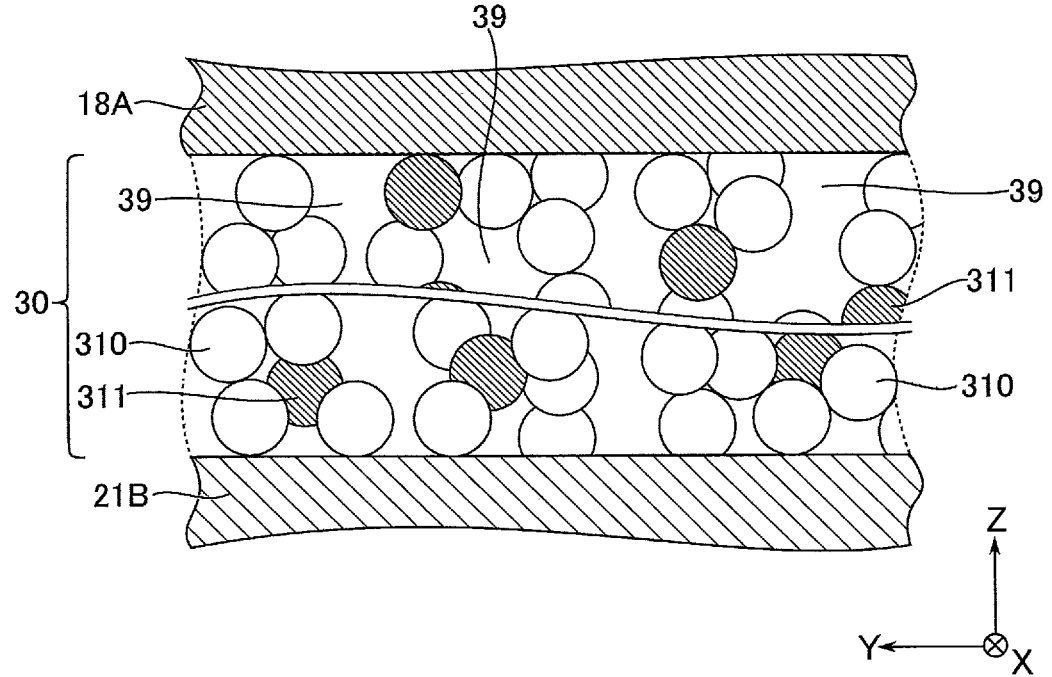
F I G. 7

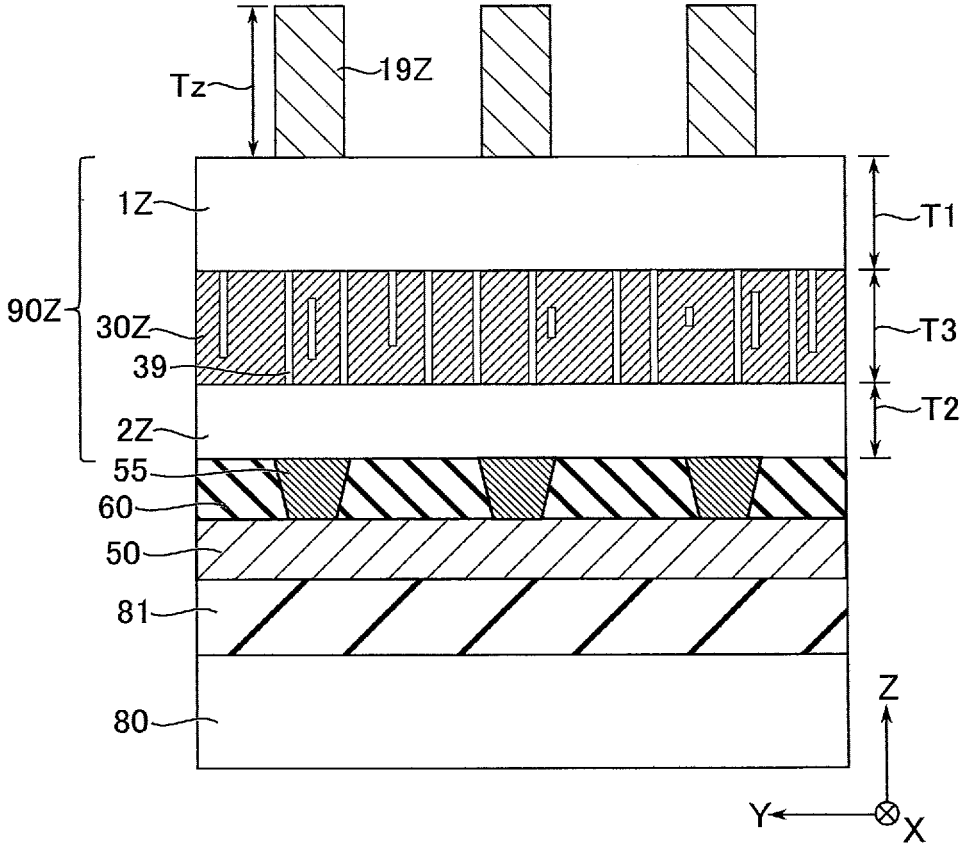
F I G. 8

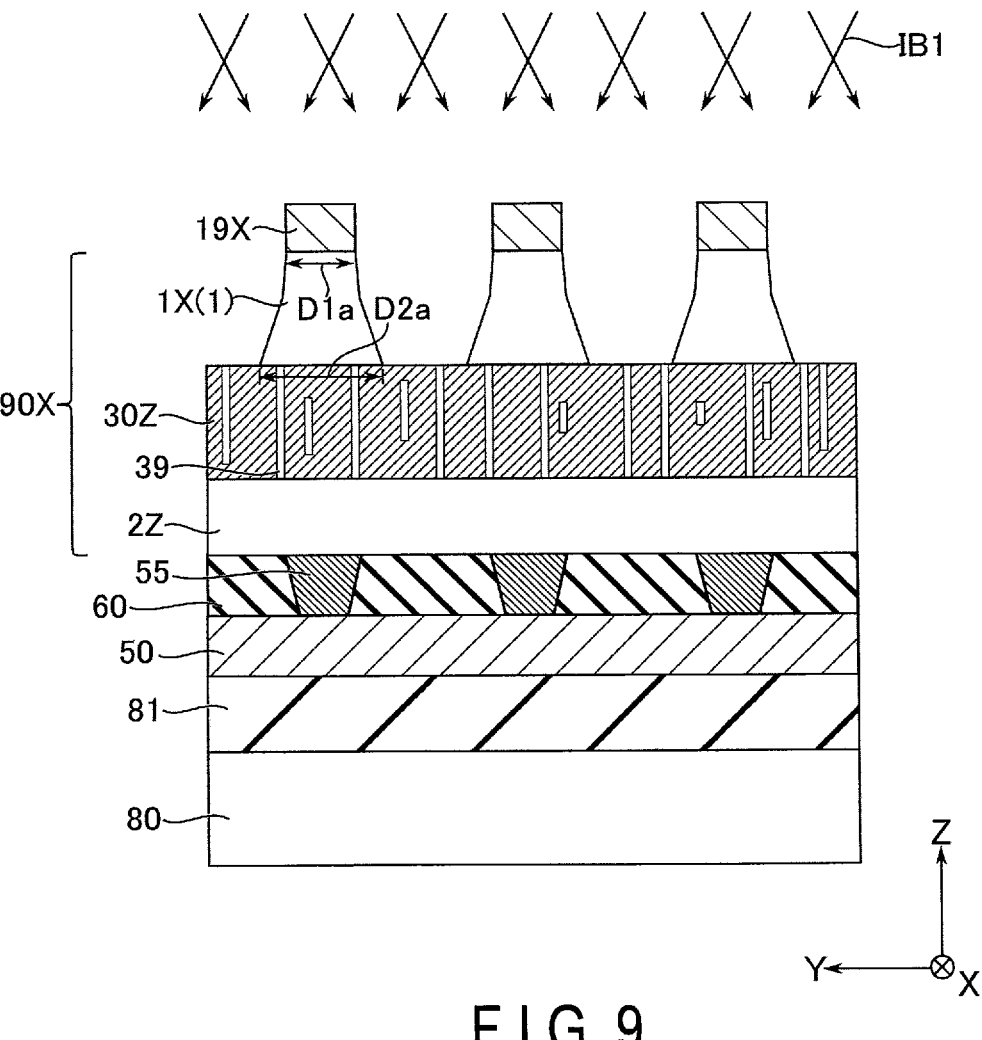
F I G. 9

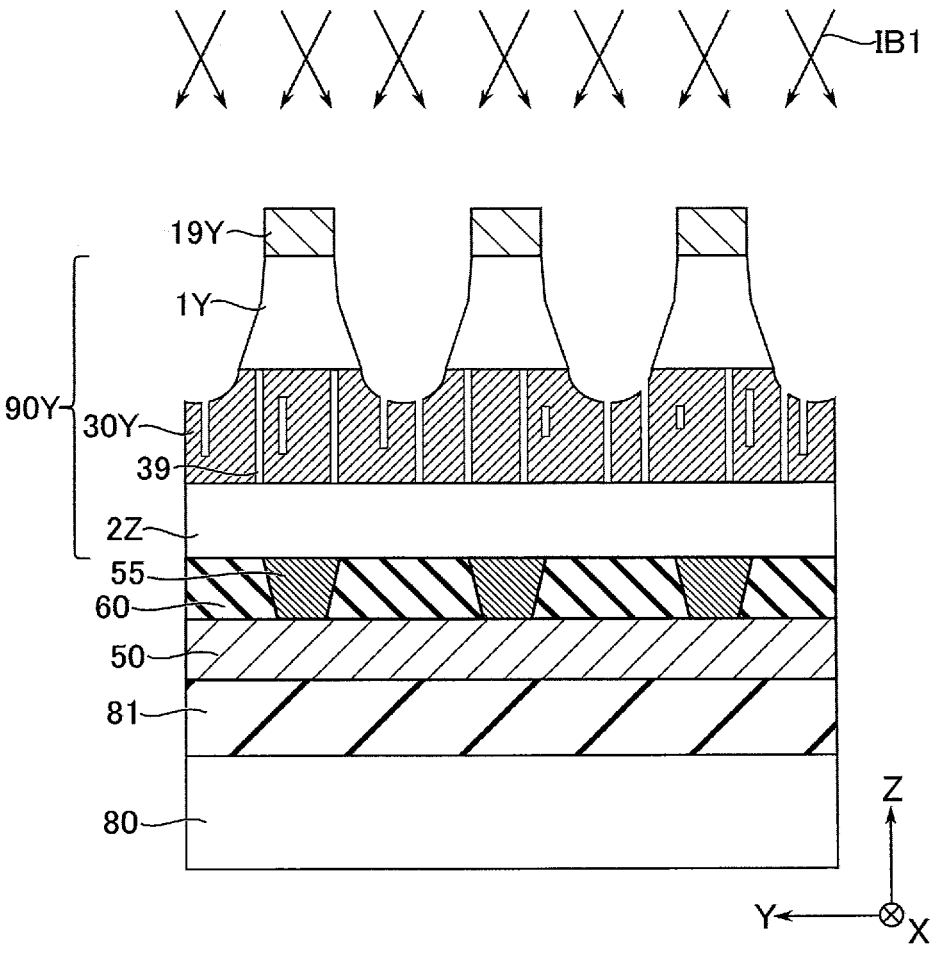
F I G. 10

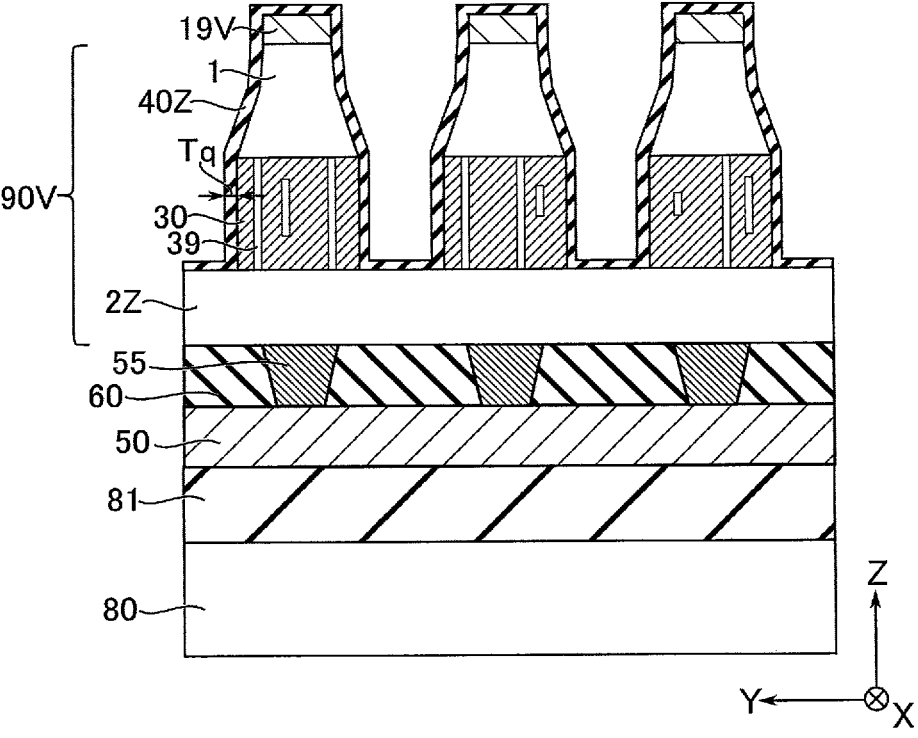
F I G. 12

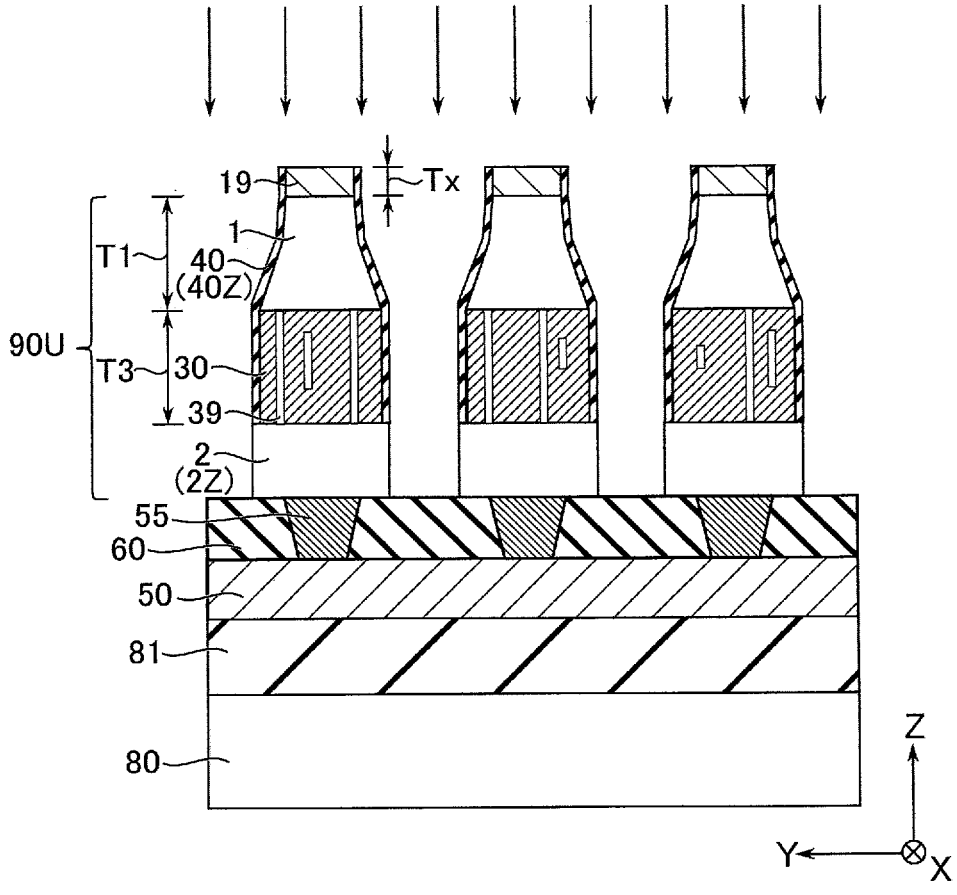
F I G. 13

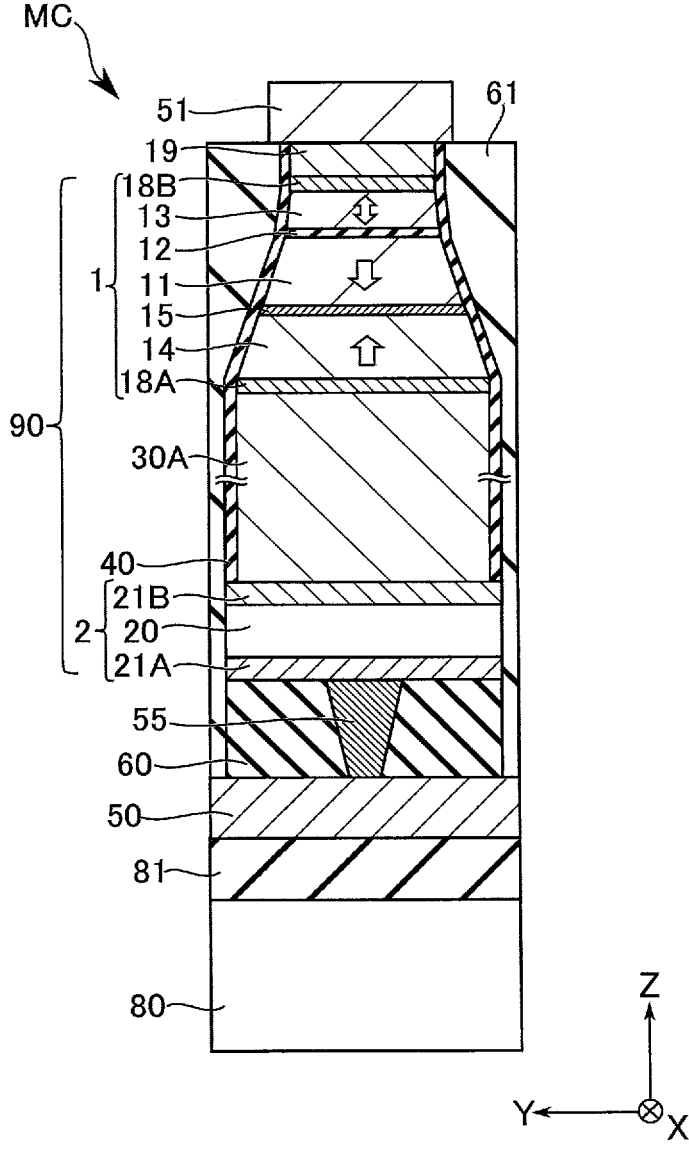
F I G. 14

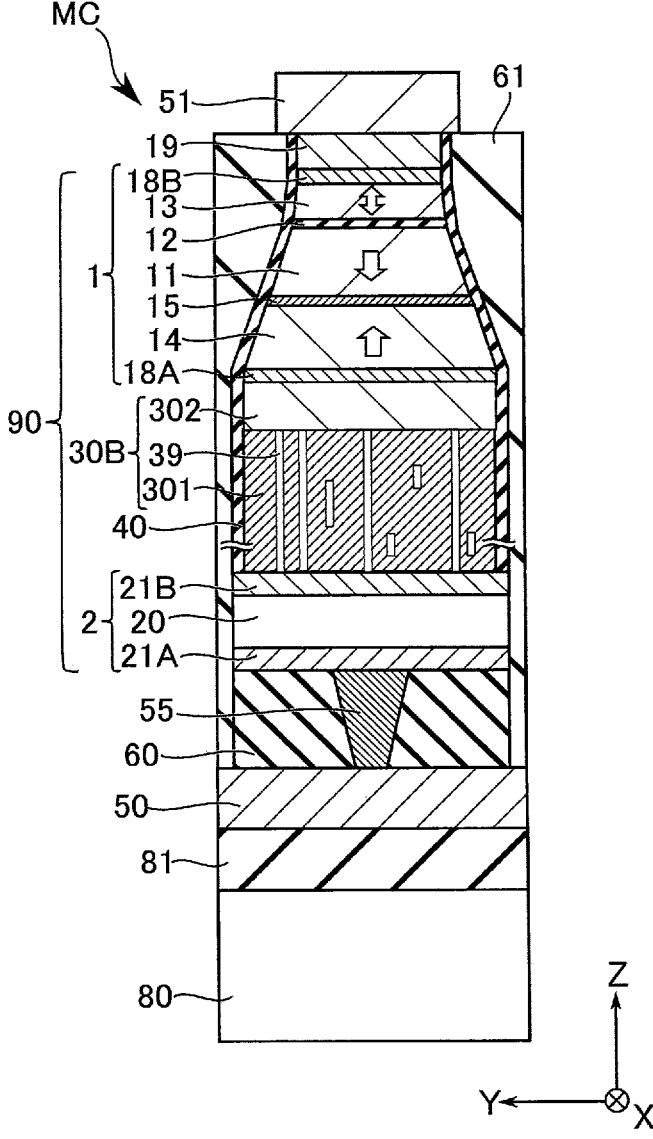
F I G. 15

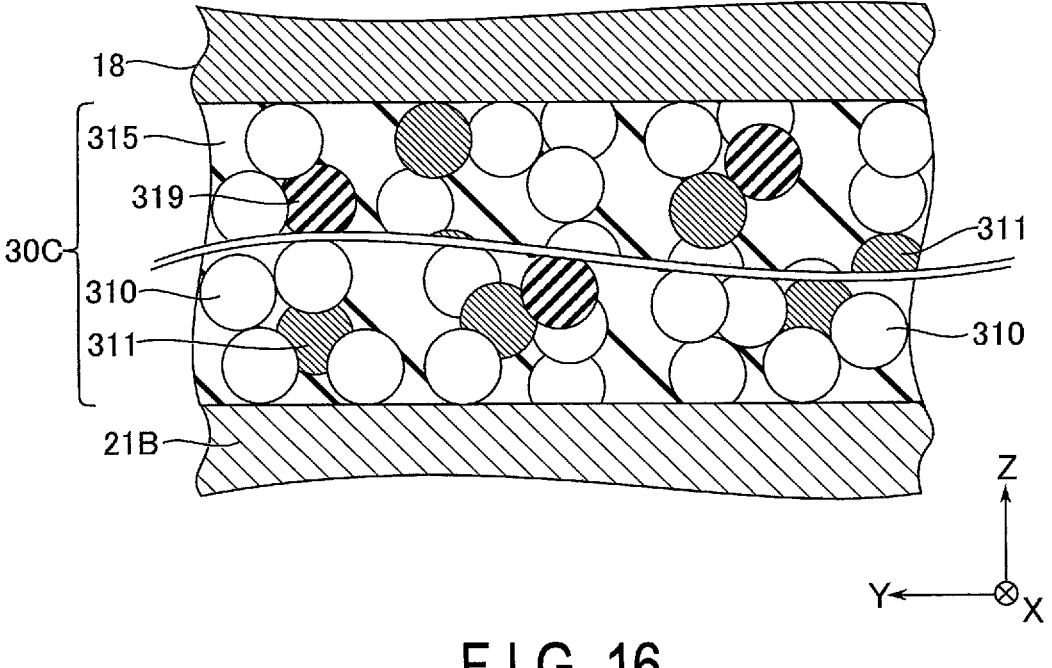
F I G. 16

MEMORY DEVICE HAVING A FIRST LAYER DISPOSED BETWEEN A MEMORY ELEMENT AND A SWITCHING ELEMENT THEREOF

CROSS-REFERENCE TO RELATED APPLICATIONS

This application is based upon and claims the benefit of priority from Japanese Patent Application No. 2022-033696, filed Mar. 4, 2022, the entire contents of which are incorporated herein by reference.

FIELD

Embodiments described herein relate generally to a memory device and a method for manufacturing a memory device.

BACKGROUND

A memory device using a variable resistance element (for example, a magnetoresistive effect element) as a memory element is known. In order to improve characteristics of a memory device, research and development of various technologies related to the memory device are promoted.

BRIEF DESCRIPTION OF THE DRAWINGS

FIG. 1 is a block diagram illustrating a configuration example of a memory device according to an embodiment.

FIG. 2 is a diagram illustrating a configuration example of a memory cell array of the memory device according to the embodiment.

FIG. 3 is a bird's-eye view illustrating the configuration example of the memory cell array of the memory device according to the embodiment.

FIG. 4 is a cross-sectional view illustrating the configuration example of the memory cell array of the memory device according to the embodiment.

FIG. 5 is a cross-sectional view illustrating the configuration example of the memory cell array of the memory device according to the embodiment.

FIG. 6 is a cross-sectional view illustrating a configuration example of a memory cell of the memory device according to the embodiment.

FIG. 7 is a diagram for explaining the configuration example of the memory cell of the memory device according to the embodiment.

FIG. 8 is a cross-sectional process diagram illustrating a process of a method for manufacturing the memory device according to the embodiment.

FIG. 9 is a cross-sectional process diagram illustrating a process of the method for manufacturing the memory device according to the embodiment.

FIG. 10 is a cross-sectional process diagram illustrating a process of the method for manufacturing the memory device according to the embodiment.

FIG. 12 is a cross-sectional process diagram illustrating a process of the method for manufacturing the memory device according to the embodiment.

FIG. 13 is a cross-sectional process diagram illustrating a process of the method for manufacturing the memory device according to the embodiment.

FIG. 14 is a cross-sectional view illustrating a modification of the memory device according to the embodiment.

FIG. 15 is a cross-sectional view illustrating a modification of the memory device according to the embodiment.

FIG. 16 is a cross-sectional view illustrating a modification of the memory device according to the embodiment.

DETAILED DESCRIPTION

Figure 11:
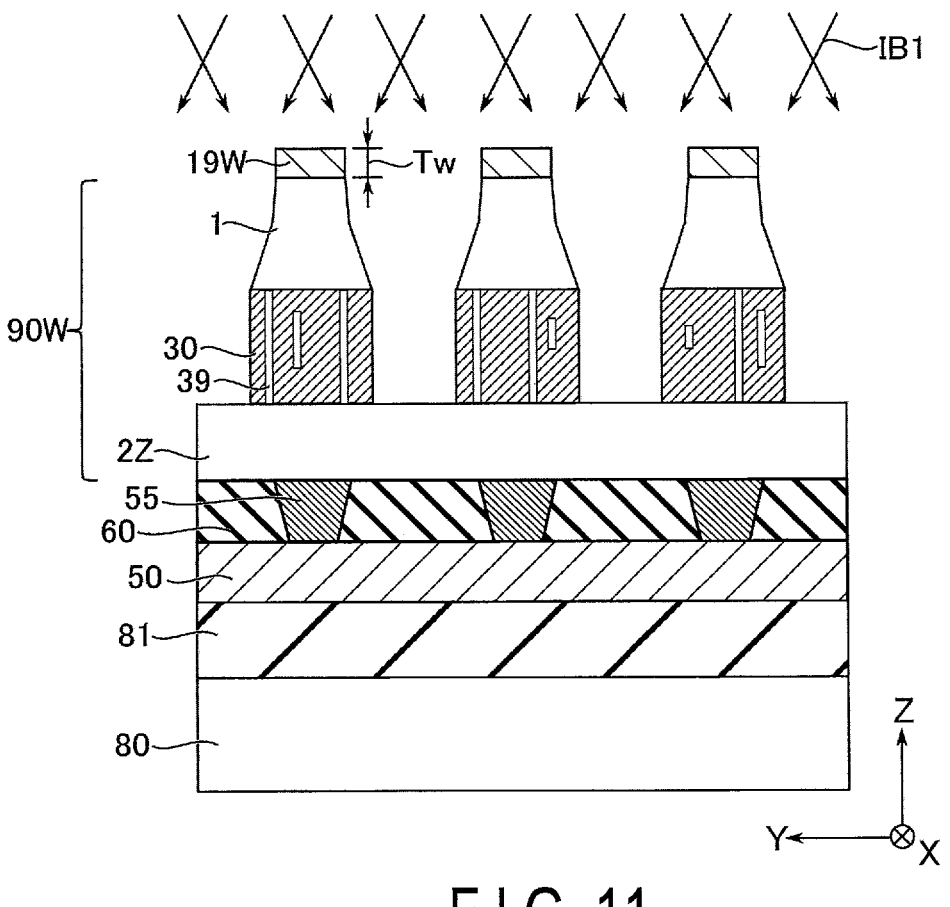
FIG. 11 is a cross-sectional process diagram illustrating a process of the method for manufacturing the memory device according to the embodiment.

Hereinafter, embodiments will be described with reference to the drawings. In the following description, components having the same functions and configurations are denoted by the same reference signs.

In the following embodiments, for a plurality of identical components (for example, circuits, interconnects, various voltages and signals, and the like), numbers and alphabetical characters may be added to ends of the reference signs for distinguishing. In a case where components having reference signs with numbers and alphabetical characters for distinguishing are not necessarily distinguished from each other, expressions (reference signs) in which the numbers and alphabetical letters at the ends are omitted are used.

In general, according to one embodiment, a memory device includes a memory element provided above a substrate in a first direction perpendicular to a first surface of the substrate; a switching element provided between the substrate and the memory element; and a first layer provided between the memory element and the switching element, wherein the first layer includes at least one selected from the group including boron, carbon, silicon, magnesium, aluminum, scandium, titanium, vanadium, gallium, germanium, yttrium, zirconium, niobium, molybdenum, palladium, silver, hafnium, tantalum, tungsten, iridium, and platinum, and the first layer includes an air gap.

Embodiment

A memory device according to an embodiment will be described with reference to FIGS. 1 to 16.

(1) Configuration Example

A configuration example of the memory device according to the embodiment will be described with reference to FIGS. 1 to 7.

(1-a) Overall Configuration

FIG. 1 is a block diagram illustrating the configuration example of the memory device 100 according to the present embodiment.

As illustrated in FIG. 1, the memory device 100 according to the present embodiment is coupled to a device (hereinafter referred to as an external device) 900 outside the memory device 100.

The external device 900 transmits a command CMD, an address ADR, and control signals CNT to the memory device 100. Data DT is transferred between the memory device 100 and the external device 900. The external device 900 transmits data (hereinafter, referred to as write data) to be written to the memory device 100 to the memory device 100 during a write operation. The external device 900 receives data (hereinafter, referred to as read data) read from the memory device 100 from the memory device 100 during a read operation.

The memory device 100 according to the present embodiment includes a memory cell array 110, a row control circuit 120, a column control circuit 130, a write circuit 140, a read circuit 150, a voltage generator 160, an input/output circuit 170, and a control circuit 180.

The memory cell array 110 includes a plurality of memory cells MC, a plurality of word lines WL, and a plurality of bit lines BL.

Each of the memory cells MC is associated with each of a plurality of rows and each of a plurality of columns in the memory cell array 110. Each of the memory cells MC is coupled to a single corresponding word line WL among the plurality of word lines WL. Each of the memory cells MC is coupled to a single corresponding bit line BL among the plurality of bit lines BL.

The row control circuit 120 is coupled to the memory cell array 110 via the word lines WL. The row control circuit 120 receives a row address (or a result of decoding the row address) of the memory cell array 110 in the address ADR. The row control circuit 120 controls the plurality of word lines WL based on the result of decoding the row address. As a result, the row control circuit 120 sets each of the plurality of word lines WL (the plurality of rows) to a selected state or an unselected state. Hereinafter, a word line WL set to the selected state is referred to as a selected word line WL, and the word lines WL other than the selected word line WL are referred to as unselected word lines WL.

The column control circuit 130 is coupled to the memory cell array 110 via the bit lines BL. The column control circuit 130 receives a column address (or a result of decoding the column address) of the memory cell array 110 in the address ADR. The column control circuit 130 controls the plurality of bit lines BL based on the result of decoding the column address. As a result, the column control circuit 130 sets each of the plurality of bit lines BL (the plurality of columns) to a selected state or an unselected state. Hereinafter, a bit line BL set to the selected state is referred to as a selected bit line BL, and the bit lines BL other than the selected bit line BL are referred to as unselected bit lines BL.

The write circuit 140 writes data to the memory cell MC. The write circuit 140 supplies a voltage (or a current) for writing data to each of the selected word line WL and the selected bit line BL. As a result, a certain write voltage (or a write current) is supplied to the selected memory cell MC. The write circuit 140 can supply any one of a plurality of write voltages according to the write data to the selected memory cell MC. For example, each of the plurality of write voltages (or write currents) has a polarity (bias direction) corresponding to the write data. For example, the write circuit 140 includes a write driver (not illustrated), a write sink (not illustrated), and the like.

The read circuit 150 reads data from the memory cell MC. The read circuit 150 amplifies a signal output from the selected memory cell MC to the selected bit line BL. The read circuit 150 determines the data in the selected memory cell MC based on the amplified signal. For example, the read circuit 150 includes a preamplifier (not illustrated), a sense amplifier (not illustrated), a read driver (not illustrated), a read sink (not illustrated), and the like.

The voltage generator 160 generates voltages for various operations of the memory cell array 110 using a power supply voltage supplied from the external device 900. For example, the voltage generator 160 generates various voltages to be used for the write operation. The voltage generator 160 outputs the generated voltages to the write circuit 140. For example, the voltage generator 160 generates various voltages to be used for the read operation. The voltage generator 160 outputs the generated voltages to the read circuit 150.

The input/output circuit 170 functions as an interface circuit related to various signals between the memory device 100 and the external device 900, such as the address ADR, the command CMD, the control signals CNT, and the data DT. The input/output circuit 170 transfers the address ADR from the external device 900 to the control circuit 180. The input/output circuit 170 transfers the command CMD from the external device 900 to the control circuit 180. The input/output circuit 170 transfers the various control signals CNT between the external device 900 and the control circuit 180. The input/output circuit 170 transfers the write data DT from the external device 900 to the write circuit 140. The input/output circuit 170 transfers, as the read data DT, data from the read circuit 150 to the external device 900.

The control circuit (also referred to as a sequencer, a state machine, or an internal controller) 180 decodes the command CMD. The control circuit 180 controls operations of the row control circuit 120, the column control circuit 130, the write circuit 140, the read circuit 150, the voltage generator 160, and the input/output circuit 170 in the memory device 100 based on the result of decoding the command CMD and the control signals CNT. For example, the control circuit 180 can decode the address ADR. The control circuit 180 transmits the result of decoding the address ADR to the row control circuit 120, the column control circuit 130, and the like. For example, the control circuit 180 includes a register circuit (not illustrated) that temporarily stores the command CMD and the address ADR. Note that the register circuit, a circuit (command decoder) for decoding the command CMD, and a circuit (address decoder) for decoding the address ADR may be provided outside the control circuit 180 in the memory device 100.

(1-b) Memory Cell Array

A configuration example of the memory cell array 110 in the memory device 100 according to the present embodiment will be described with reference to FIGS. 2 to 5.

FIG. 2 is an equivalent circuit diagram illustrating the configuration example of the memory cell array 110 of the memory device 100 according to the present embodiment.

As illustrated in FIG. 2, the plurality of memory cells MC are arranged in a matrix in the memory cell array 110. Each of the memory cells MC is coupled to a single corresponding bit line BL among the plurality of bit lines BL (BL<0>, BL<1>, . . . , BL<i−1>) and a single corresponding word line WL among the plurality of word lines WL (WL<0>, WL<1>, . . . , WL<j−1>). i and j are integers of 2 or more.

Each of the memory cells MC includes a memory element 1 and a selector 2.

The memory element 1 is, for example, a variable resistance element. The resistance state of the memory element 1 is changed to any one of a plurality of resistance states (for example, a low resistance state and a high resistance state) by a supplied voltage (or current). The memory element 1 can store data by associating the resistance state of the element 1 with data (for example, "0" data and "1" data).

The selector 2 functions as a selection element of the memory cell MC. The selector 2 has a function of controlling supply of a voltage (or a current) to the memory element 1 at the time of writing data to the corresponding memory element 1 and at the time of reading data from the corresponding memory element 1.

For example, the selector 2 is a two-terminal switching element. Hereinafter, the selector 2 is referred to as a switching element 2. When a voltage applied between the two terminals of the switching element 2 is less than a threshold voltage of the switching element 2, the switching element 2 changes to the off state (high resistance state, electrically non-conductive state). When the voltage applied between the two terminals of the switching element 2 is equal to or larger than the threshold voltage of the switching element 2, the switching element 2 changes to the on state (low resistance state, electrically conductive state). The two-terminal switching element 2 may have the above-described function regardless of the polarity (for example, positive polarity and negative polarity) of the applied voltage.

The switching element 2 can switch whether to cause a current to flow in the memory cell MC according to the magnitude of the voltage applied to the memory cell MC, regardless of the polarity (direction of the current flowing in the memory cell MC) of the voltage applied to the memory cell MC.

FIGS. 3 to 5 are diagrams for explaining a structure example of the memory cell array 110 of the memory device 100 according to the present embodiment. FIG. 3 is a bird's-eye view for explaining the structure example of the memory cell array 110. FIG. 4 is a schematic cross-sectional view illustrating a cross-sectional structure of the memory cell array 110 along a Y direction (Y axis). FIG. 5 is a schematic cross-sectional view illustrating a cross-sectional structure of the memory cell array 110 along an X direction (X axis).

As illustrated in FIGS. 3 to 5, the memory cell array 110 is provided above an upper surface of a substrate 80.

The X direction is parallel to the upper surface of the substrate 80. The Y direction is parallel to the upper surface of the substrate 80 and intersects the X direction. Hereinafter, a plane parallel to the upper surface of the substrate 80 is referred to as an X-Y plane. A direction (axis) perpendicular to the X-Y plane is a Z direction (Z axis). A plane parallel to the X direction and the Z direction is referred to as an X-Z plane. A plane parallel to the Y direction and the Z direction is referred to as a Y-Z plane.

A plurality of interconnects (conductive layers) 50 are provided above the upper surface of the substrate 80 via an insulating layer 81 on the substrate 80 in the Z direction. The plurality of interconnects 50 are arranged along the X direction. Each of the interconnects 50 extends along the Y direction. Each of the plurality of interconnects 50 functions as, for example, a bit line BL.

A plurality of interconnects (conductive layers) 51 are provided above the plurality of interconnects 50 in the Z direction. The plurality of interconnects 51 are arranged along the Y direction. Each of the interconnects 51 extends along the X direction. Each of the plurality of interconnects 51 functions as, for example, a word line WL.

The plurality of memory cells MC are provided between the plurality of interconnects 50 and the plurality of interconnects 51. The plurality of memory cells MC are arranged in a matrix in the X-Y plane.

A plurality of memory cells MC arranged in the Y direction are provided on a single interconnect 50 in the Z direction. A plurality of memory cells MC arranged in the Y direction are coupled to a common bit line BL.

A plurality of memory cells MC arranged in the X direction are provided under a single interconnect 51 in the Z direction. A plurality of memory cells MC arranged in the X direction are coupled to a common word line WL.

A space having a certain dimension (interval) in the Y direction is provided between two memory cells MC arranged in the Y direction. A space having a certain dimension (interval) in the X direction is provided between two memory cells MC arranged in the X direction. The interval between the two memory cells MC in the Y direction is substantially the same as the interval between the two memory cells MC in the X direction. However, the interval between the memory cells MC in the Y direction may be different from the interval between the memory cells MC in the X direction.

An insulating layer (not illustrated) is provided between the memory cells MC.

For example, when the memory cell array 110 has the circuit configuration illustrated in FIG. 2, the switching elements 2 (selectors 2) are provided below the memory elements 1 in the Z direction. The switching elements 2 are provided between the memory elements 1 and the interconnects 50. The memory elements 1 are provided between the interconnects 51 and the switching elements 2.

As described above, each of the memory cells MC is a stack of the memory element 1 and the switching element 2. With the memory cells MC, the memory cell array 110 has a stacked memory cell array structure.

Each of the memory cells MC may have a tapered cross-sectional shape according to a process (for example, an etching method) used for forming the memory cell array 110.

FIGS. 4 and 5 illustrate an example in which the insulating layer 81 is provided between the plurality of interconnects 50 and the substrate 80. When the substrate 80 is a semiconductor substrate, one or more field-effect transistors (not illustrated) may be provided on a semiconductor region of the upper surface of the substrate 80. The field-effect transistor is covered with the insulating layer 81. The field-effect transistor on the substrate 80 is a constituent element of a circuit such as the row control circuit 120. The field-effect transistor is coupled to the memory cell array 110 via a contact plug (not illustrated) and an interconnect (not illustrated) in the insulating layer 81. As described above, a circuit for controlling the operation of the memory cell array 110 may be provided below the memory cell array 110 in the Z direction. When the substrate 80 is an insulating substrate, the plurality of interconnects 50 may be directly provided on the upper surface of the substrate 80 without the insulating layer 81.

The circuit configuration and structure of the stacked memory cell array 110 are not limited to the example illustrated in FIGS. 2 to 5. The circuit configuration and structure of the memory cell array 110 can be appropriately modified according to the coupling relationships of the memory elements 1 and the switching elements 2 with respect to the bit lines BL and the word lines WL. For example, the structure of the memory cell array 110 having the circuit configuration illustrated in FIG. 2 is not limited to the example illustrated in FIGS. 3 to 5. For example, the switching elements 2 may be provided above the memory elements 1 in the Z direction. In this case, the interconnects 51 are used as the bit lines BL, and the interconnects 50 are used as the word lines WL.

Note that FIGS. 3 to 5 illustrate an example in which each of the memory cells MC has a prismatic structure, but each of the memory cells MC may have a columnar (or elliptical columnar) structure.

(1-c) Memory Cells

FIG. 6 is a cross-sectional view schematically illustrating a configuration example of each of the memory cells MC in the memory device 100 according to the present embodiment.

As illustrated in FIG. 6, in the memory cell MC of the stack 90, the memory element 1 and the switching element 2 are arranged in the Z direction. As described above, the memory element 1 is provided above the switching element 2 in the Z direction.

For example, the variable resistance element as the memory element 1 is a magnetoresistive effect element. In this case, the memory device 100 according to the present embodiment is a magnetic memory such as a magnetoresistive random access memory (MRAM).

Configuration Example of Switching Elements

As illustrated in FIG. 6, the switching element 2 includes at least a variable resistance layer (also referred to as a selector layer or a switch layer) 20 and two electrodes (conductive layers) 21A and 21B. The variable resistance layer 20 is provided between the two electrodes 21A and 21B in the Z direction. The resistance state (resistance value) of the variable resistance layer changes. The variable resistance layer 20 may have a plurality of resistance states.

In the example of FIG. 6, the electrode (hereinafter, also referred to as a lower electrode) 21A is provided below the variable resistance layer 20 in the Z direction, and the electrode (hereinafter, also referred to as an upper electrode) 21B is provided above the variable resistance layer 20 in the Z direction. For example, the electrode 21A is provided between the interconnect 50 and the variable resistance layer 20. The electrode 21B is provided between the variable resistance layer 20 and the magnetoresistive effect element 1.

The switching element 2 is coupled to the interconnect 50 via the electrode 21A. The switching element 2 is coupled to the magnetoresistive effect element 1 via the electrode 21B.

The switching element 2 has a dimension T2 in a direction (for example, the Z direction) perpendicular to the surface of the substrate 80. The switching element 2 has a dimension D2 in a direction (for example, the X direction or the Y direction) parallel to the surface of the substrate 80.

The resistance state of the variable resistance layer 20 becomes a high resistance state (non-conductive state) or a low resistance state (conductive state) according to the voltage applied to the above-described switching element 2 (memory cell MC). When the resistance state of the variable resistance layer 20 is the high resistance state, the switching element 2 is off. When the resistance state of the variable resistance layer 20 is the low resistance state, the switching element 2 is on.

When the memory cell MC is set to the selected state, since the switching element 2 is turned on, the resistance state of the variable resistance layer 20 is the low resistance state. In this case, the switching element 2 supplies a voltage (or a current) to the memory element 1. When the memory cell MC is set to the unselected state, since the switching element 2 is turned off, the resistance state of the variable resistance layer is the high resistance state. In this case, the switching element 2 interrupts the supply of the voltage (or the current) to the memory element 1.

Depending on the material of the variable resistance layer 20, a change in the resistance state of the variable resistance layer 20 may depend on the current (for example, the magnitude of the current) flowing in the switching element 2 (memory cell MC).

The variable resistance layer 20 of the switching element 2 includes (contains) at least a single element selected from the group consisting of boron (B), aluminum (Al), gallium (Ga), indium (In), carbon (C), silicon (Si), germanium (Ge), tin (Sn), arsenic (As), phosphorus (P), and antimony (Sb).

The switching element 2 may include, for example, an insulator including a dopant (impurity) in the variable resistance layer 20. The dopant added to the insulator is an impurity that contributes to electrical conduction in the insulator. An example of the insulator used for the variable resistance layer 20 of the switching element 2 is silicon oxide. When the material of the variable resistance layer 20 is silicon oxide, the dopant added to the silicon oxide is phosphorus or arsenic. Note that the type of dopant added to the silicon oxide of the variable resistance layer 20 is not limited to the above-described example.

Configuration Example of Magnetoresistive Effect Elements

As illustrated in FIG. 6, the magnetoresistive effect element 1 includes two magnetic layers 11 and 13 and a nonmagnetic layer 12. The nonmagnetic layer 12 is provided between the two magnetic layers 11 and 13 in the Z direction. In the example of FIG. 6, the plurality of layers 11, 12, and 13 are arranged in the Z direction in the order of the magnetic layer 11, the nonmagnetic layer 12, and the magnetic layer 13 from the interconnect (for example, the bit line BL) 50 side toward the interconnect (for example, the word line WL) 51 side.

The two magnetic layers 11 and 13 and the nonmagnetic layer 12 form a magnetic tunnel junction. Hereinafter, the magnetoresistive effect element 1 including the magnetic tunnel junction is referred to as an MTJ element 1. The nonmagnetic layer 12 in the MTJ element 1 is referred to as a tunnel barrier layer.

The magnetic layers 11 and 13 are ferromagnetic layers including (containing) at least a single element selected from cobalt (Co), iron (Fe), and nickel (Ni), for example. Furthermore, the magnetic layers 11 and 13 may further includes boron (B). More specifically, for example, the magnetic layers 11 and 13 include cobalt iron boron (CoFeB) or iron boride (FeB). Each of the magnetic layers 11 and 13 may be a single layer film (for example, an alloy film) or a multilayer film (for example, an artificial lattice film). The tunnel barrier layer 12 is, for example, an insulating layer (for example, a magnesium oxide layer) including oxygen (O) and magnesium (Mg). The tunnel barrier layer 12 may be a single layer film or a multilayer film. The tunnel barrier layer 12 may further include an element other than oxygen and magnesium.

In the present embodiment, the MTJ element 1 is a perpendicular magnetization type magnetoresistive effect element.

For example, each of the magnetic layers 11 and 13 has perpendicular magnetic anisotropy. The easy magnetization axis direction of each of the magnetic layers 11 and 13 is perpendicular to layer surfaces (film surfaces) of the magnetic layers 11 and 13. Each of the magnetic layers 11 and 13 has magnetization perpendicular to the layer surfaces of the magnetic layers 11 and 13. The magnetization direction of each of the magnetic layers 11 and 13 is parallel to the arrangement direction (Z direction) of the magnetic layers 11 and 13.

Of the two magnetic layers 11 and 13, one magnetic layer has a variable magnetization direction, and the other magnetic layer has an invariable magnetization direction. The MTJ element 1 may have a plurality of resistance states (resistance values) according to the relative relationship (magnetization alignment) between the magnetization direction of one of the magnetic layers and the magnetization direction of the other magnetic layer.

In the example of FIG. 6, the magnetization direction of the magnetic layer 13 is variable. The magnetization direction of the magnetic layer 11 is invariable (fixed state). Hereinafter, the magnetic layer 13 whose magnetization direction is variable is referred to as a storage layer. Hereinafter, the magnetic layer 11 whose magnetization direction is invariable is referred to as a reference layer. Note that the storage layer 13 may also be referred to as a free layer, a magnetization free layer, or a magnetization variable layer. The reference layer 11 may also be referred to as a pin layer, a pinned layer, a magnetization invariant layer, or a magnetization fixed layer.

In the present embodiment, "the magnetization direction of the reference layer (magnetic layer) is invariable" or "the magnetization direction of the reference layer (magnetic layer) is in a fixed state" means that in a case where a current or a voltage for changing the magnetization direction of the storage layer 13 is supplied to the MTJ element 1, the magnetization direction of the reference layer 11 is not changed by the supplied current or the supplied voltage before and after the supply of the current or the voltage.

When the magnetization direction of the storage layer 13 is the same as the magnetization direction of the reference layer 11 (when the magnetization alignment state of the MTJ element 1 is a parallel alignment state), the resistance state of the MTJ element 1 is a first resistance state. When the magnetization direction of the storage layer 13 is different from the magnetization direction of the reference layer 11 (when the magnetization alignment state of the MTJ element 1 is an antiparallel alignment state), the resistance state of the MTJ element 1 is a second resistance state different from the first resistance state. For example, the resistance value of the MTJ element 1 in the second resistance state (antiparallel alignment state) is higher than the resistance value of the MTJ element 1 in the first resistance state (parallel alignment state).

Hereinafter, regarding the magnetization alignment state of the MTJ element 1, the parallel alignment state is also referred to as a P (parallel) state, and the antiparallel alignment state is also referred to as an AP (anti-parallel) state.

Depending on the circuit configuration of the memory cell array 110, the reference layer may be provided above the tunnel barrier layer 12 in the Z direction, and the storage layer may be provided below the tunnel barrier layer 12 in the Z direction.

For example, the MTJ element 1 includes conductive layers (electrodes) 18A and 18B. The magnetic layers 11 and 13 and the tunnel barrier layer 12 are provided between the two conductive layers 18A and 18B in the Z direction. The reference layer 11 is provided between the conductive layer 18A and the tunnel barrier layer 12. The storage layer 13 is provided between the conductive layer 18B and the tunnel barrier layer 12.

For example, a shift cancelling layer 14 may be provided in the MTJ element 1. In this case, the shift cancelling layer 14 is provided between the reference layer 11 and the conductive layer 18A. The shift cancelling layer 14 is a magnetic layer for mitigating the effects of the stray field of the reference layer 11. In a case where the MTJ element 1 includes the shift cancelling layer 14, the nonmagnetic layer 15 is provided between the shift cancelling layer 14 and the reference layer 11. The nonmagnetic layer 15 is, for example, a metal layer such as a ruthenium layer. The shift cancelling layer 14 is antiferromagnetically coupled to the reference layer 11 via the nonmagnetic layer 15. As a result, a stack including the reference layer 11 and the shift cancelling layer 14 forms a synthetic antiferromagnetic (SAF) structure. In the synthetic anti-ferromagnetic structure, the magnetization direction of the shift cancelling layer 14 is opposite to the magnetization direction of the reference layer 11. With the synthetic anti-ferromagnetic structure, the magnetization orientation of the reference layer 11 can be more stably fixed. Note that a set of the two magnetic layers 11 and 14 and the nonmagnetic layer 15 forming the synthetic anti-ferromagnetic structure may be referred to as a reference layer.

For example, a nonmagnetic layer (not illustrated) called an underlayer may be provided between the shift cancelling layer 14 and the conductive layer 18A. The underlayer is a layer for improving characteristics (for example, crystallinity and magnetic properties) of the magnetic layer (here, the shift cancelling layer 14) in contact with the underlayer.

For example, a nonmagnetic layer (not illustrated) called a capping layer may be provided between the storage layer 13 and the conductive layer 18B. The capping layer is a layer for improving characteristics (for example, crystalline and magnetic properties) of the magnetic layer (here, the storage layer 13) in contact with the capping layer.

The MTJ element 1 has a dimension T1 in the Z direction. For example, the dimension T1 is larger than or equal to dimension T2. However, the dimension T1 may be smaller than the dimension T2 depending on the structure of the memory element 1.

The MTJ element 1 has a tapered cross-sectional structure. Regarding dimensions D1$a$ and D1$b$ of the tapered MTJ element 1 in a direction (X direction or Y direction) parallel to the surface of the substrate 80, the dimension D1$b$ on the lower side (interconnect 50 side) of the MTJ element 1 is larger than the dimension D1$a$ on the upper side (interconnect 51 side) of the MTJ element 1.

The taper angle on the upper side of the MTJ element 1 may be different from the taper angle on the lower side of the MTJ element 1. For example, the taper angle on the upper portion (for example, a portion above the tunnel barrier layer 12) side of the MTJ element 1 is larger than the taper angle on the lower portion (for example, a portion below the tunnel barrier layer 12) side of the MTJ element 1. In the present embodiment, the taper angle of the MTJ element 1 is an angle formed by a side surface of a certain portion of the MTJ element 1 and a direction parallel to the upper surface of the substrate 80.

A conductive layer 19 is provided between the MTJ element 1 and the interconnect 51. The interconnect 51 is electrically coupled to the electrode 18B of the MTJ element 1 via the conductive layer 19. The conductive layer 19 is, for example, a tungsten layer or a molybdenum layer. The conductive layer 19 is used, for example, as a mask layer (hard mask) for etching at the time of forming the memory cell MC. Hereinafter, the conductive layer 19 may be referred to as a mask layer 19.

When the conductive layer 19 is used as an electrode of the MTJ element 1, the conductive layer 18B may not be provided.

The conductive layer 19 has a dimension Tx in the direction (here, in the Z direction) perpendicular to the surface of the substrate 80. The dimension Tx is smaller than the dimension T1. A dimension of a certain portion (for example, the bottom portion of the conductive layer 19) of the conductive layer 19 in a direction (X direction or Y direction) parallel to the surface of the substrate 80 is, for example, substantially the same as the dimension D1$a$.

In the memory device 100 according to the present embodiment, each of the memory cells MC includes an intermediate layer 30 between the MTJ element 1 and the switching element 2.

The intermediate layer 30 includes at least a single member selected from boron (B), carbon (C), silicon (Si), magnesium (Mg), aluminum (Al), scandium (Sc), titanium (Ti), vanadium (V), gallium (Ga), germanium (Ge), yttrium (Y), zirconium (Zr), niobium (Nb), molybdenum (Mo), palladium (Pd), silver (Ag), hafnium (Hf), tantalum (Ta), tungsten (W), iridium (Ir), and platinum (Pt).

The intermediate layer 30 is, for example, a layer including a member selected from the group described above. The intermediate layer 30 may be a compound layer of the selected member. A specific example of the intermediate layer 30 is a silicon oxide layer or a silicon carbide layer. The intermediate layer 30 may be a layer in which at least one selected from the group described above is added to a certain base material. In this case, the intermediate layer 30 includes a plurality of granular portions made of a member selected from the group described above in the base material. For example, the intermediate layer 30 may be an organic layer including a member selected from the group described above.

The intermediate layer 30 includes a plurality of air gaps 39 within the layer. As a more specific example, the intermediate layer 30 is a porous layer (also referred to as a nanoporous layer).

The intermediate layer 30 has a dimension T3 in the direction (here, in the Z direction) perpendicular to the surface of the substrate 80. The dimension T3 is equal to or larger than the dimension T1. The dimension T3 is larger than the dimension Tx.

For example, the side surface of the intermediate layer 30 is substantially parallel to the Z direction and substantially perpendicular to the upper surface of the substrate 80. In this case, the dimension of the lower portion (interconnect 50 side) of the intermediate layer is substantially the same as the dimension of the upper portion (interconnect 51 side) of the intermediate layer 30. The intermediate layer 30 has a dimension D3 in a direction (here, the X direction or the Y direction) parallel to the upper surface of the substrate 80. The dimension D3 of the intermediate layer 30 is smaller than the dimension D2 of the switching element 2.

FIG. 7 is a schematic diagram illustrating an example of a structure of the intermediate layer 30 in the memory device 100 according to the present embodiment.

As illustrated in FIG. 7, the intermediate layer includes a plurality of granular portions 310. The granular portions 310 are made of at least a single member among the above-described members such as B, C, Si, Mg, Al, Sc, Ti, V, Ga, Ge, Y, Zr, Nb, Mo, Pd, Ag, Hf, Ta, W, Ir, and Pt. The granular portions 310 are irregularly arranged in the intermediate layer 30.

The air gaps 39 are provided in spaces between the granular portions 310. The air gaps 39 may have a tunnel-like structure extending from one end to the other end of the intermediate layer 30, or may have a closed space structure surrounded by the plurality of granular portions 310 in the intermediate layer 30.

The intermediate layer 30 may include a granular portion 311 made of a member other than the member of the granular portions 310. The granular portion 311 is irregularly provided in the intermediate layer 30. The granular portion 311 is an insulator (for example, silicon oxide or silicon nitride), a conductor, or an organic substance.

In the configuration illustrated FIG. 7, the etching rate of the intermediate layer 30 is higher than the etching rate of the conductive layer 19.

Note that, although FIG. 7 illustrates the granular portions 310 and 311 having a circular shape (spherical shape) for simplification of the drawing, shapes of the granular portions 310 and 311 may be another shape (for example, a polygonal shape).

Returning to FIG. 6, an insulating layer 40 is continuously provided on the side surface of the conductive layer 19, the side surface of the MTJ element 1, and the side surface of the intermediate layer 30. The insulating layer 40 continuously covers the side surface of the conductive layer 19, the side surface of the MTJ element 1, and the side surface of the intermediate layer 30. The side surface of the conductive layer 19, the side surface of the MTJ element 1, and the side surface of the intermediate layer 30 are surfaces intersecting a direction parallel to the upper surface of the substrate 80.

The insulating layer 40 includes an oxide, a nitride, an oxynitride, or the like. The insulating layer may be a single layer film or a stacked film. For example, the insulating layer 40 is a silicon nitride film.

The insulating layer 40 has a film thickness Tq. The film thickness Tq of the insulating layer 40 is a dimension of the insulating layer 40 in a direction (for example, the X direction or the Y direction) parallel to the upper surface of the substrate 80. In the present embodiment, the film thickness Tq of the insulating layer is a thickness of a portion provided on the side surface of the intermediate layer 30. For example, the above-described dimension D2 is substantially equal to the sum (D3+2×Tq) of the value twice the film thickness Tq and the dimension D3.

For example, plugs 55 are provided between the switching element 2 and the interconnect 50. The plug 55 are provided in the insulating layer 60. The insulating layer 60 is provided between the switching element 2 and the interconnect 50. The interconnect 50 is electrically coupled to the lower electrode 21A of the switching element 2 via the plugs 55. Note that the lower electrode 21A of the switching element 2 may be directly provided on the interconnect 50 without the plugs 55. In this case, the insulating layer 60 is also not provided between the switching element 2 and the interconnect 50.

An insulating layer 61 covers the side surface of the memory cell MC. The insulating layer 61 is provided between the memory cells MC.

In the present embodiment, in the process of forming the memory cell MC, the etching rate of the intermediate layer 30 is higher than the etching rate of another constituent member (for example, the magnetic layers 11 and 13 or the conductive layer 19) of the memory cell MC. For example, in the process of forming the memory cell MC, the dimension (>Tx) of the conductive layer 19 in the Z direction at the time of depositing the conductive layer 19 is larger than the dimension (for example, dimension T3) of the intermediate layer 30 in the Z direction at the time of depositing the intermediate layer 30.

(2) Manufacturing Method

A method for manufacturing the memory device 100 according to the present embodiment will be described with reference to FIGS. 8 to 13.

FIGS. 8 to 13 are schematic cross-sectional process diagrams illustrating manufacturing processes in the method for manufacturing the memory device 100 according to the present embodiment.

As illustrated in FIG. 8, after a circuit (not illustrated) of the memory device 100, such as the row control circuit, is formed on the substrate (semiconductor substrate) 80, the insulating layer 81 is formed on the substrate 80. The insulating layer 81 covers the circuit on the substrate 80.

The plurality of conductive layers 50 are formed on the insulating layer 81. The conductive layers 50 are layers for forming the interconnect (for example, the bit lines BL) of the memory cell array 110. The insulating layer 60 is formed on the conductive layers 50. A plurality of contact holes are formed in the insulating layer 60 at predetermined positions which are arrangement positions of the memory cells. The plurality of plugs 55 are formed in the plurality of contact holes so as to be in contact with the conductive layers 50.

A stack 90Z is formed on the insulating layer 60 and the plugs 55. The stack 90Z includes a plurality of constituent members of the memory cells MC.

For example, a member 2Z, which will be constituent members of the switching elements 2 described above, is formed on the insulating layer 60 and the plugs 55. The member 2Z includes at least a conductive layer to be the lower electrodes 21A, a layer to be the variable resistance layers 20, a conductive layer to be the upper electrodes 21B, and the like stacked in the Z direction. The member 2Z has a dimension (thickness) T2 in the Z direction.

In the present embodiment, an intermediate layer 30Z is formed on the member 2Z. The intermediate layer 30Z has a dimension (thickness) T3 in the Z direction.

The intermediate layer 30Z includes (contains) one selected from boron (B), carbon (C), silicon (Si), magnesium (Mg), aluminum (Al), scandium (Sc), titanium (Ti), vanadium (V), gallium (Ga), germanium (Ge), yttrium (Y), zirconium (Zr), niobium (Nb), molybdenum (Mo), palladium (Pd), silver (Ag), hafnium (Hf), tantalum (Ta), tungsten (W), iridium (Ir), platinum (Pt), and the like.

The intermediate layer 30Z is a porous layer. That is, the plurality of air gaps 39 and the plurality of granular portions (not illustrated) are formed in the intermediate layer 30Z. For example, the air gaps 39 in the intermediate layer 30Z are formed using a known technique using a corrosive action or an etching action of a certain member.

A member 1Z for the memory elements 1 described above is formed on the intermediate layer 30Z. In a case where each of the memory elements 1 is an MTJ element, the member 1Z includes at least a magnetic layer serving as the reference layer 11, a nonmagnetic layer serving as the tunnel barrier layer 12, a magnetic layer serving as the storage layer 13, a conductive layer serving as the electrodes 18A and 18B, and the like, which are stacked in the Z direction. The member 1Z may further include a magnetic layer serving as the shift cancelling layer 14, a nonmagnetic layer between the reference layer 11 and the shift cancelling layer 14, an underlayer, or the like. The member 1Z has a dimension (thickness) T1 in the Z direction. For example, the dimension T1 of the member 1Z is substantially the same as the dimension T3 of the intermediate layer 30Z. However, the dimension T3 of the intermediate layer 30Z may be larger than the dimension T1 of the member 1Z.

A plurality of mask layers 19Z are formed on the stack 90Z. Each mask layer 19Z is formed at an arrangement position of each memory cell MC by photolithography and etching, or the like. For example, a certain mask layer 19Z is disposed above a certain plug 55 in the Z direction.

Each mask layer 19Z has a dimension (thickness) Tz in the Z direction. For example, the dimension Tz of each mask layer 19Z is equal to or larger than the dimension T3 of the intermediate layer 30Z. In this case, the dimension Tz of each mask layer 19Z is equal to or larger than the dimension T1 of the member 1Z.

As illustrated in FIG. 9, a stack 90X is processed by ion beam etching. For example, an ion beam IB1 is incident on the stack 90X from a direction inclined at a certain angle with respect to a direction parallel (or a direction perpendicular) to the upper surface of the substrate 80.

The stack 90X is etched by the inclined ion beam IB1. As a result, it is possible to suppress adhesion of a conductive scattered matter generated by etching of a conductor such as a magnetic layer to an exposed side surface of a member 1X. As a result, a short circuit between the magnetic layers 11 and 13 caused by the conductor (hereinafter, referred to as a conductive deposit) attached to the side surface of the member 1X is reduced.

The etched side surface of the member 1X is inclined with respect to a direction parallel to (or perpendicular to) the upper surface of the substrate 80 according to an etching rate (an incident angle of the ion beam IB1) of each layer constituting the member 1X.

As a result, the member 1X has a tapered structure. Regarding dimensions of the member 1X in the direction (for example, the Y direction) parallel to the surface of the substrate 80, a dimension D2$a$ of a lower portion (portion on the substrate 80 side) of the member 1X is larger than a dimension D1$a$ of an upper portion (portion on the mask layer 19X side) of the member 1X.

For example, the etching rate of a plurality of constituent members (layers) under a certain etching condition may be different for each constituent member. In order to suppress adhesion of the scattered matter described above and remove the conductive deposit described above, the incident angle of the ion beam IB1 at the time of processing on the lower side of the member 1X may be different from the incident angle of the ion beam IB1 at the time of processing on the upper side of the member 1X. As a result, as in the example of FIG. 9, the taper angle on the upper side of the member 1X may be different from the taper angle on the lower side of the member 1X.

As illustrated in FIG. 10, an intermediate layer 30Y is processed continuously with the formation of a member 1Y. The intermediate layer 30Y is etched by ion beam etching under the same conditions as the etching on the member (MTJ elements) 1Y. The processed member 1Y functions as a mask for etching on the intermediate layer 30Y.

In the present embodiment, a material having an etching rate higher than the etching rate of mask layers 19Y and the etching rate of the plurality of constituent members of the member 1Y is used for the intermediate layer 30Y. The material of the intermediate layer 30Y including the plurality of air gaps 39 is a substance having a sparse density compared to the material of the mask layers 19Y.

As a result, the intermediate layer 30Y is etched at an etching rate higher than that of the mask layers 19Y.

As illustrated in FIG. 11, the intermediate layer is separated for each memory cell MC by etching using the ion beam IB1.

For example, during a period for the etching of the intermediate layer 30, the side surface of the MTJ element 1Y is etched, and the spread of the tapered MTJ element 1Y is reduced.

By such etching by the ion beam IB1, the MTJ element 1 is formed.

The etched side surface of the intermediate layer is substantially parallel to the direction (Z direction) perpendicular to the upper surface of the substrate 80. An angle formed by the upper surface of the substrate 80 and the side surface of the intermediate layer 30 is substantially 90 degrees.

Etching of a stack 90W is temporarily stopped (interrupted) using the upper surface of the member 2Z as an etching stopper.

Mask layers 19W are gradually etched by the ion beam IB1 at an etching rate lower than those of the MTJ elements 1 (member 1Z) and the intermediate layers 30 (30Z). A dimension Tw of each mask layer 19W in the Z direction is smaller than the dimension Tz at the time of deposition.

As illustrated in FIG. 12, in the processed stack 90V, an insulating layer 40Z is formed on mask layers 19V, the MTJ elements 1, and the intermediate layers 30. The insulating layer 40Z covers the side surfaces of the MTJ elements 1 and the side surfaces of the intermediate layers 30. For example, the insulating layer 40Z is a silicon nitride film. The insulating layer 40Z has a thickness Tq in the X direction (or the Y direction).

As illustrated in FIG. 13, after the formation of the insulating layer 40Z, the processing of a stack 90U is resumed. As a result, the insulating layer 40Z and the member 2Z are etched. The etching of the insulating layer 40Z and the member 2Z is performed by, for example, anisotropic etching such as reactive ion etching. However, the etching of the insulating layer 40Z and the member 2Z may be performed by ion beam etching.

For example, at the time of etching the member 2Z by reactive ion etching, ion species of an etching gas are incident on the stack 90U from the direction (Z direction) perpendicular to the upper surface of the substrate 80.

At the time of etching the member 2Z, in addition to the mask layers 19 and the MTJ elements 1 and the intermediate layers 30 above the member 2Z, the insulating layer 40Z functions as a mask for etching the member 2Z.

The member 2Z is separated for each memory cell MC by etching. As a result, the plurality of switching elements 2, the mask layers 19, and the insulating layer are formed.

Through the above processes, the plurality of memory cells MC are formed above the substrate 80.

As a result of the etching of the stack 90 described above, the dimension Tx of each mask layer 19 in the Z direction is smaller than the dimension T3 of each intermediate layer 30 in the Z direction and the dimension T1 of each MTJ element 1 in the Z direction.

For example, the mask layer 19 is used as a part of the upper electrode of the memory element 1 without being removed. However, the mask layer 19 may be removed after processing (formation of the memory cell MC) of the stack 90.

As illustrated in FIG. 6, the insulating layer 61 is formed on the insulating layer 60 and the memory cells MC so as to be embedded in a region between the plurality of memory cells MC. The insulating layer 61 is removed from the upper surfaces of the mask layers 19 so that the mask layers 19 are exposed.

Thereafter, as illustrated in FIGS. 3 to 6, the plurality of interconnects 51 extending in the X direction are formed on the insulating layer 61 and the mask layers 19.

As a result, the memory cell array 110 of the memory device 100 according to the present embodiment is formed.

Thereafter, various constituent members for coupling the memory cell array 110 to a lower layer circuit can be formed based on a known technique.

Through the above manufacturing processes, the memory device 100 according to the present embodiment is completed.

(3) Summary

In a general memory device having a plurality of memory cells each including a memory element and a selector provided at different heights along the Z direction, there has been a possibility that a plurality of memory cells adjacent in the X direction or the Y direction cannot be sufficiently separated due to a reduction in an interval between the memory cells.

For example, in a case where an MTJ element has a tapered structure in order to prevent a short circuit caused by an attached matter, an interval between memory cells below the MTJ element tends to be smaller, and it tends to be difficult to separate members (for example, switching elements) below the MTJ element.

In the memory device (for example, the MRAM) 100 according to the present embodiment, the intermediate layers 30 are provided between the memory elements (for example, the MTJ elements) 1 and the switching elements (selectors) 2.

The etching rate of the intermediate layers 30 is higher than the etching rate of other members (for example, the mask layers 19). As a result, even if the etching conditions of the intermediate layers 30 are the same as the etching conditions of the MTJ elements 1, the intermediate layers 30 have the side surfaces substantially perpendicular to the upper surface of the substrate 80 without having a tapered structure.

Therefore, relatively large spaces occur between the plurality of intermediate layers 30 adjacent in the X direction and the Y direction. Even in a state where the side surfaces of the MTJ elements 1 and the side surfaces of the intermediate layers 30 are covered with the insulating layer 40, relatively large spaces can be formed between the intermediate layers 30. As a result, in the present embodiment, a space for processing a member below the MTJ elements 1 (for example, a plurality of layers for constituting the switching elements 2) is secured without increasing intervals (pitches) between the memory cells MC in the X direction and the Y direction.

Therefore, in the present embodiment, the switching element 2 is separated for each memory cell MC without the occurrence of processing failure of a member for forming the switching element 2.

In the present embodiment, even when the dimensions of the lower portions of the MTJ elements 1 are larger than the dimensions of the upper portions of the MTJ elements 1 in the tapered MTJ elements 1, spaces for processing the switching elements 2 below the MTJ elements 1 can be secured by the arrangement of the intermediate layers 30 and the etching of the intermediate layers 30. Therefore, the side surfaces of the MTJ elements 1 can be irradiated with the ion beam inclined at an angle sufficient for removing a conductive deposit.

As a result, the memory device 100 according to the present embodiment can reduce defects caused by a short circuit between the magnetic layers 11 and 13 due to the conductive deposit.

In the present embodiment, the thickness of the insulating layer 40 covering the MTJ elements 1 can be increased by securing a space between the memory cells MC by the arrangement of the intermediate layers 30. As a result, the memory device 100 according to the present embodiment can reduce damage to the MTJ elements 1 due to etching at the time of processing the switching elements 2.

The flatness of the surface of each switching element 2 may be degraded depending on the constituent member of the switching element 2. For example, when a silicon oxide layer is used for the variable resistance layer, a dopant (for example, arsenic) may be doped into the silicon oxide layer. In this case, the surface of each switching element 2 becomes rough. When the MTJ element 1 is formed on the switching element 2 having the rough surface, the layer constituting the MTJ element 1 is adversely affected by the roughness of the surface of the switching element 2. As a result, the characteristics of the MTJ element 1 may be degraded.

In the memory device 100 according the present embodiment, the intermediate layers 30 can reduce the roughness of the surfaces of the switching elements 2. Therefore, in the present embodiment, the adverse effect exerted by the layers constituting the MTJ elements 1 from the roughened surfaces of the lower switching elements 2 can be reduced.

As a result, the memory device 100 according to the present embodiment can improve the characteristics of the MTJ elements 1.

In the present embodiment, the distances between the MTJ elements 1 and the switching elements 2 increase depending on the arrangement of the intermediate layers 30. Therefore, heat propagation between the MTJ elements 1 and the switching elements 2 is reduced. When the intermediate layers 30 includes metal, heat dissipation characteristics of the memory cells MC are improved by the intermediate layers 30. As a result, in the present embodiment, the thermal stability of the MTJ elements 1 is improved. Therefore, the reliability of the operation of the memory device 100 according to the present embodiment is improved.

As described above, the memory device according to the embodiment can reduce defects of the memory device.

(4) Modifications

Modifications of the memory device according to the embodiment will be described with reference to FIGS. 14 to 16.

Each of FIGS. 14, 15, and 16 illustrates a cross-sectional structure of a memory cell MC in a modification of the memory device 100 according to the embodiment.

As illustrated in FIG. 14, an intermediate layer 30A may not be a porous layer as long as the intermediate layer 30A is a member capable of securing a high etching rate as compared with the etching rate of a hard mask (or a constituent member of a memory element). In this case, the intermediate layer 30A does not include an air gap.

The intermediate layer (intermediate layer that is not a porous layer) 30A not including an air gap is a layer (film) including at least a single member selected from boron (B), silicon (Si), magnesium (Mg), aluminum (Al), scandium (Sc), titanium (Ti), vanadium (V), gallium (Ga), germanium (Ge), yttrium (Y), zirconium (Zr), niobium (Nb), molybdenum (Mo), palladium (Pd), silver (Ag), hafnium (Hf), iridium (Ir), and platinum (Pt).

Similarly to the above-described example, the dimension of the intermediate layer 30A in the Z direction is larger than a dimension of an MTJ element 1 in the Z direction. The dimension of the intermediate layer 30A in the Z direction is larger than a dimension of a conductive layer 19 in the Z direction.

As illustrated in FIG. 15, an intermediate layer 30B may include a plurality of layers 301 and 302. For example, the material of the layer 301 is different than the material of the layer 302. As an example, of the layers 301 and 302, the layer 301 is a porous layer that includes an air gap 39. Of the layers 301 and 302, the other layer 302 does not include an air gap.

The layer 302 is provided between a conductive layer 18A and the porous layer 301. Therefore, the flatness of the base of a magnetic layer 14 (and the conductive layer 18A) is improved. As a result, characteristics of an MTJ element 1 are improved.

For example, the dimension (film thickness) of the layer 302 in the Z direction is desirably smaller than the dimension of a conductive layer 19 in the Z direction and the dimension of the layer 301 in the Z direction. Under the etching conditions of the MTJ element 1, the etching rate of the layer 302 is desirably lower than the etching rate of the conductive layer 19.

As an example of the material of the layer 301, the layer 301 includes, for example, one selected from among boron, carbon, silicon, magnesium, aluminum, scandium, titanium, vanadium, gallium, germanium, yttrium, zirconium, niobium, molybdenum, palladium, silver, hafnium, tantalum, tungsten, iridium, platinum, and the like.

The layer 302 is made of a known material used for an electrode (conductive layer) in a memory cell MC of an MRAM.

Under a certain etching condition during processing of the memory cell, the etching rate of the entire intermediate layer 30B including the plurality of layers 301 and 302 is higher than the etching rate of the conductive layer (hard mask) 19. Therefore, after the layers 301 and 302 are etched, the conductive layer 19 remains on the MTJ element 1.

FIG. 15 illustrates an example in which the intermediate layer 30B includes the two layers 301 and 302. However, the intermediate layer 30B may include three or more layers.

As illustrated in FIG. 16, an intermediate layer 30C may be a layer in which an insulator 315 is provided in a space between granular portions 310 instead of air gaps. For example, the insulator 315 is silicon oxide, silicon carbide, or an organic substance.

The intermediate layer 30C further includes a plurality of holes 319.

A memory device according to each of the modifications illustrated in FIGS. 14, 15, and 16 can obtain effects similar to the effects of the memory device according to the above-described embodiment.

(5) Others

In the above-described embodiment, the MRAM is illustrated as the memory device 100 according to the present embodiment. However, the memory device 100 according to the present embodiment may be a memory device other than the MRAM as long as the intermediate layers 30 are provided between the memory elements 1 and the selectors (switching elements) 2 in the memory cells MC.

For example, the memory device 100 according to the embodiment may be a memory device (for example, a resistance change memory such as a resistance random access memory (ReRAM)) using a variable resistance element (for example, a transition metal oxide element) as a memory element, a memory device (for example, a phase change memory such as a phase change random access memory (PCRAM)) using a phase change element as a memory element, or a memory device (for example, a ferroelectric memory such as a ferroelectric random access memory (FeRAM)) using a ferroelectric element as a memory element.

The memory device 100 according to the present embodiment can obtain the effects described in the above-described embodiment even when the memory device 100 is a memory device other than the MRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a memory element provided above a substrate in a first direction perpendicular to a first surface of the substrate;

a switching element provided between the substrate and the memory element, the switching element including a variable resistance layer;

a first conductive layer provided above the memory element in the first direction; and a first layer provided between the memory element and the switching element, a dimension of the first layer in a second direction parallel to the first surface being equal to or larger than a dimension of the memory element in the second direction, and the dimension of the first layer in the second direction being smaller than a dimension of the variable resistance layer in the second direction, wherein:

the first layer includes at least one selected from a group including boron, carbon, silicon, magnesium, aluminum, scandium, titanium, vanadium, gallium, germanium, yttrium, zirconium, niobium, molybdenum, palladium, silver, hafnium, tantalum, tungsten, iridium, and platinum, the first layer includes an air gap, a dimension of the first layer in the first direction is larger than a dimension of the first conductive layer in the first direction, and an etching rate of the first layer is higher than an etching rate of the first conductive layer.

2. The memory device according to claim 1, wherein the first conductive layer is a tungsten layer or a molybdenum layer.

3. The memory device according to claim 1, wherein a dimension of the first layer in the first direction is equal to or larger than a dimension of the memory element in the first direction.

4. The memory device according to claim 1, wherein a dimension of a lower portion of the memory element is larger than a dimension of an upper portion of the memory element.

5. The memory device according to claim 1, wherein a side surface of the first layer is parallel to the first direction.

6. The memory device according to claim 1, further comprising:

a first conductive layer provided above the memory element in the first direction; and a first insulating layer provided continuously on a side surface of the first conductive layer, a side surface of the memory element, and a side surface of the first layer.

7. The memory device according to claim 1, further comprising:

a first insulating layer provided continuously on a side surface of the memory element and a side surface of the first layer, wherein the dimension of the variable resistance layer in the second direction is equal to a sum of the dimension of the first layer in the second direction and a value twice a dimension of the first insulating layer in the second direction.

8. A memory device comprising:

a memory element provided above a substrate in a first direction perpendicular to a first surface of the substrate;

a switching element provided between the substrate and the memory element, the switching element including a variable resistance layer;

a first layer provided between the memory element and the switching element, a dimension of the first layer in a second direction parallel to the first surface being equal to or larger than a dimension of the memory element in the second direction, and the dimension of the first layer in the second direction being smaller than a dimension of the variable resistance layer in the second direction; and a first insulating layer provided continuously on a side surface of the memory element and a side surface of the first layer, wherein:

the first layer includes at least one selected from a group including boron, carbon, silicon, magnesium, aluminum, scandium, titanium, vanadium, gallium, germanium, yttrium, zirconium, niobium, molybdenum, palladium, silver, hafnium, tantalum, tungsten, iridium, and platinum, the first layer includes an air gap, and the dimension of the variable resistance layer in the second direction is equal to a sum of the dimension of the first layer in the second direction and a value twice a dimension of the first insulating layer in the second direction.

9. The memory device according to claim 8, further comprising:

a first conductive layer provided above the memory element in the first direction, wherein a dimension of the first layer in the first direction is larger than a dimension of the first conductive layer in the first direction.

10. The memory device according to claim 9, wherein the first conductive layer is a tungsten layer or a molybdenum layer.

11. The memory device according to claim 9, wherein an etching rate of the first layer is higher than an etching rate of the first conductive layer.

12. The memory device according to claim 8, wherein a dimension of the first layer in the first direction is equal to or larger than a dimension of the memory element in the first direction.

13. The memory device according to claim 8, wherein a dimension of a lower portion of the memory element is larger than a dimension of an upper portion of the memory element.

14. The memory device according to claim 8, wherein a side surface of the first layer is parallel to the first direction.

15. The memory device according to claim 8, further comprising:

a first conductive layer provided above the memory element in the first direction; and a first insulating layer provided continuously on a side surface of the first conductive layer, a side surface of the memory element, and a side surface of the first layer.

* * * * *